United States Patent
Tsou et al.

(10) Patent No.: US 11,742,388 B2
(45) Date of Patent: Aug. 29, 2023

(54) NANOWIRE STACK GAA DEVICE WITH SELECTABLE NUMBERS OF CHANNEL STRIPS

(71) Applicants: Taiwan Semiconductor Manufacturing Co., Ltd., Hsinchu (TW); National Taiwan University, Taipei (TW)

(72) Inventors: Ya-Jui Tsou, Hsinchu (TW); Zong-You Luo, Hsinchu (TW); Wen Hung Huang, Hsinchu (TW); Jhih-Yang Yan, Hsinchu (TW); Chee-Wee Liu, Hsinchu (TW)

(73) Assignees: Taiwan Semiconductor Manufacturing Co., Ltd., Hsinchu (TW); National Taiwan University, Taipei (TW)

( * ) Notice: Subject to any disclaimer, the term of this patent is extended or adjusted under 35 U.S.C. 154(b) by 0 days.

(21) Appl. No.: 17/871,730

(22) Filed: Jul. 22, 2022

(65) Prior Publication Data
US 2023/0015775 A1  Jan. 19, 2023

Related U.S. Application Data

(62) Division of application No. 16/590,156, filed on Oct. 1, 2019, now Pat. No. 11,411,082.

(60) Provisional application No. 62/753,748, filed on Oct. 31, 2018.

(51) Int. Cl.
*H01L 29/78* (2006.01)
*H01L 29/10* (2006.01)
*H01L 29/66* (2006.01)
*H01L 29/06* (2006.01)
*H01L 29/08* (2006.01)

(52) U.S. Cl.
CPC ...... *H01L 29/1037* (2013.01); *H01L 29/0673* (2013.01); *H01L 29/0847* (2013.01); *H01L 29/66795* (2013.01); *H01L 29/785* (2013.01)

(58) Field of Classification Search
CPC .......... H01L 29/0847; H01L 29/66795; H01L 29/785; H01L 29/1037
See application file for complete search history.

(56) References Cited

U.S. PATENT DOCUMENTS

| | | | |
|---|---|---|---|
| 8,823,102 | B2 | 9/2014 | van Dal et al. |
| 9,748,404 | B1 | 8/2017 | Chang et al. |
| 2017/0140933 | A1 | 5/2017 | Lee et al. |
| 2018/0090624 | A1 | 3/2018 | Cheng et al. |
| 2018/0151452 | A1 | 5/2018 | Doornbos et al. |
| 2019/0103317 | A1 | 4/2019 | Yu et al. |
| 2019/0131394 | A1 | 5/2019 | Reznicek et al. |
| 2020/0006154 | A1 | 1/2020 | Chiang et al. |
| 2020/0006155 | A1 | 1/2020 | Chiang et al. |
| 2021/0119031 | A1 | 4/2021 | Song et al. |

*Primary Examiner* — Douglas M Menz
(74) *Attorney, Agent, or Firm* — Seed IP Law Group LLP

(57) ABSTRACT

The current disclosure describes techniques for individually selecting the number of channel strips for a device. The channel strips are selected by defining a three-dimensional active region that include a surface active area and a depth/height. Semiconductor strips in the active region are selected as channel strips. Semiconductor strips contained in the active region will be configured to be channel strips. Semiconductor strips not included in the active region are not selected as channel strips and are separated from source/drain structures by an auxiliary buffer layer.

20 Claims, 17 Drawing Sheets

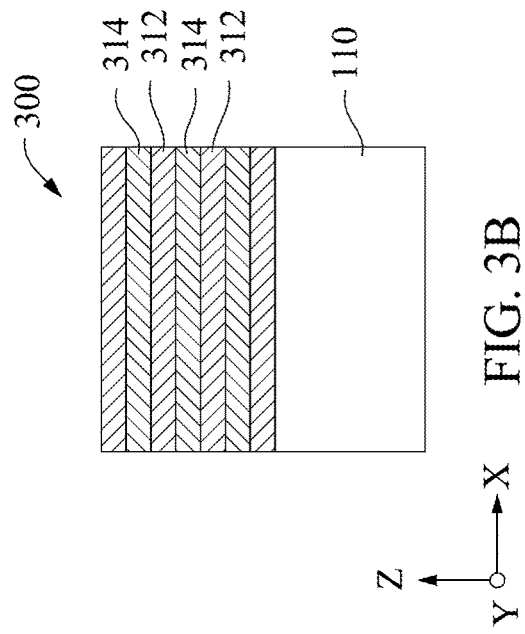
FIG. 3B
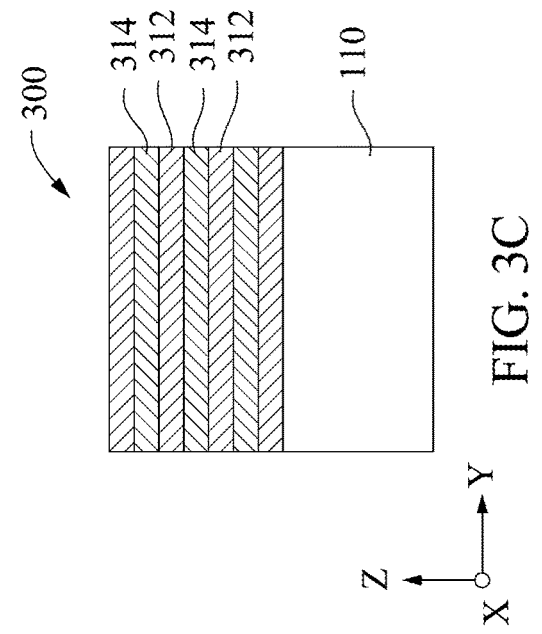
FIG. 3C
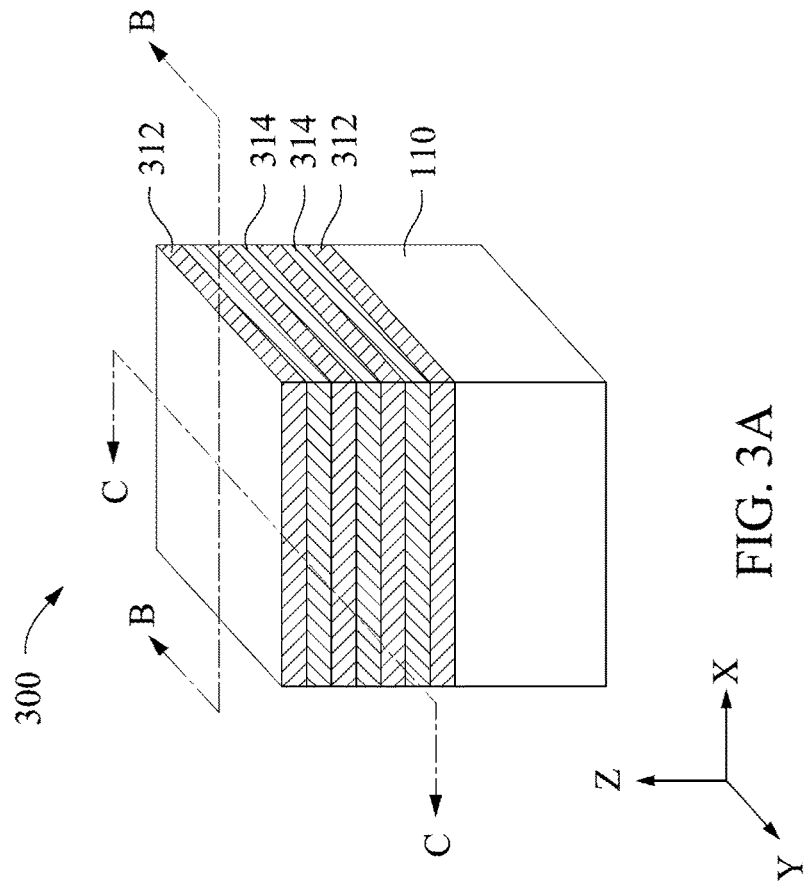
FIG. 3A
FIG. 3

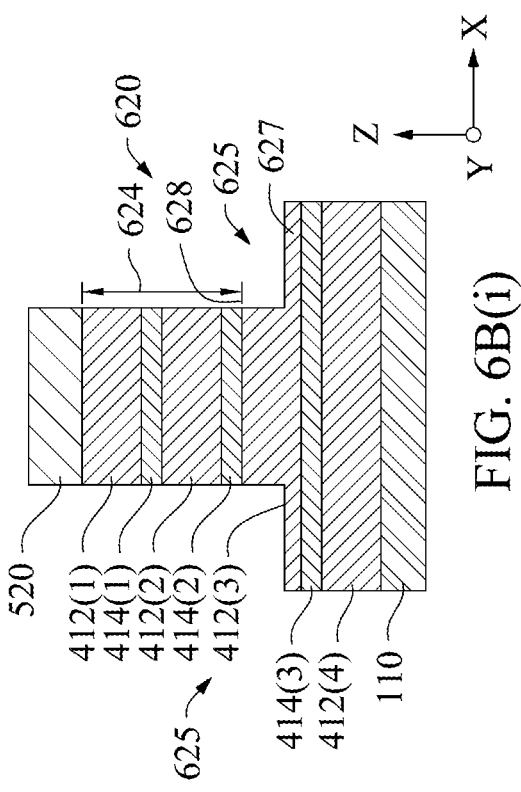
FIG. 6A
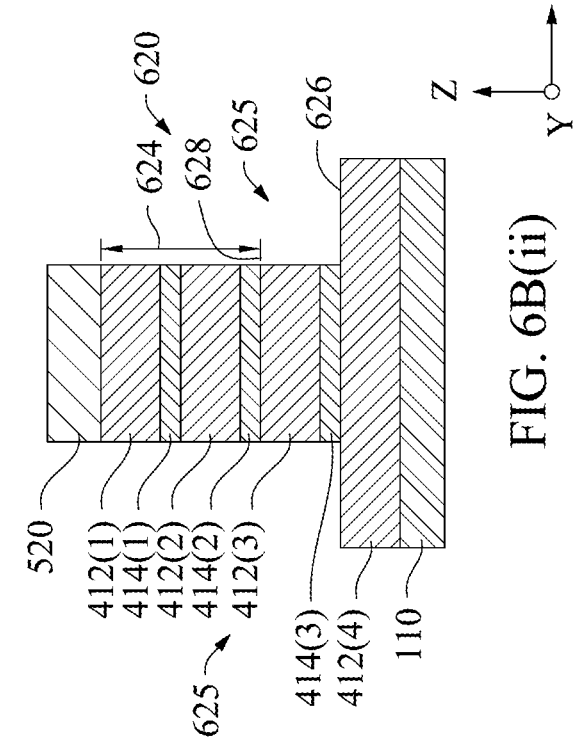
FIG. 6B(i)
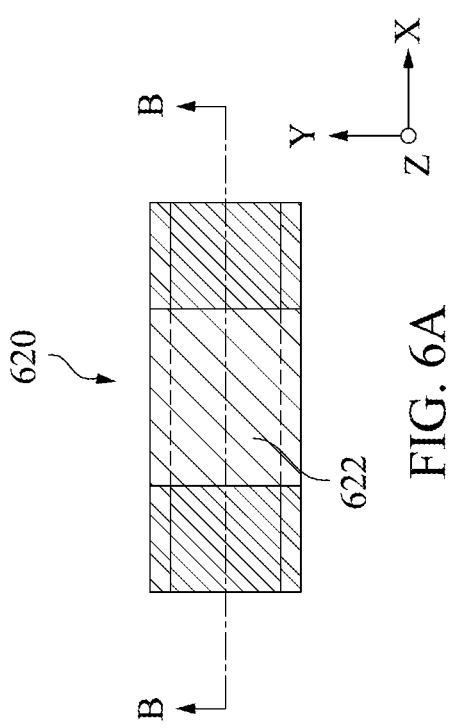
FIG. 6B
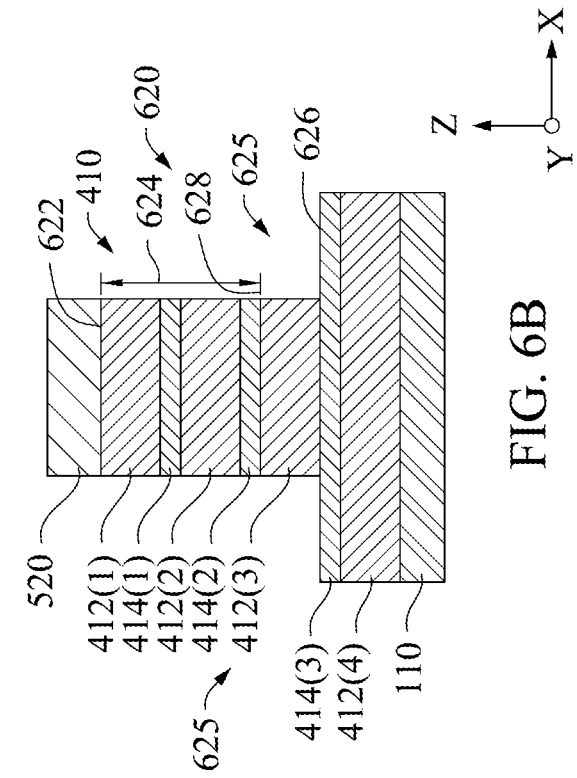
FIG. 6B(ii)

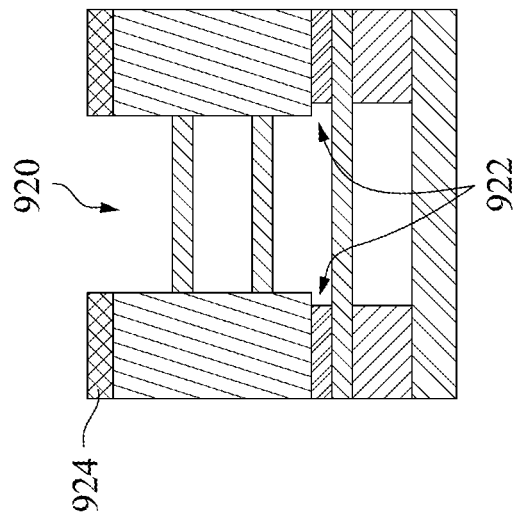
FIG. 9
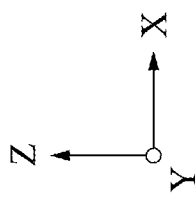
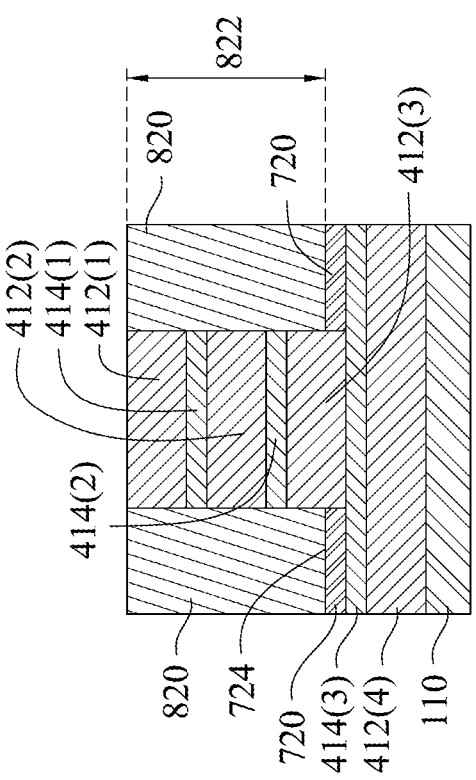
FIG. 8
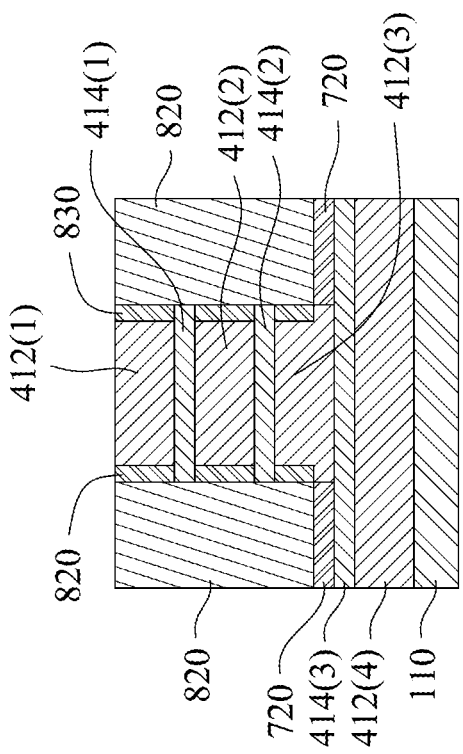

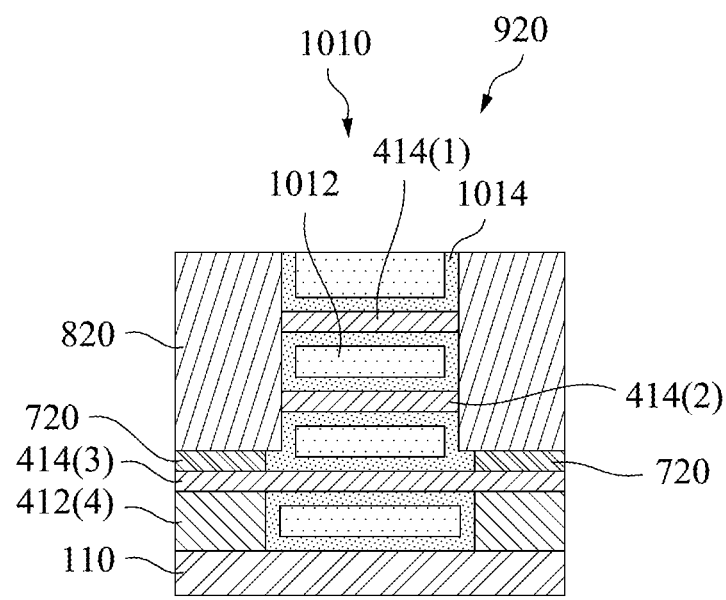
FIG. 10
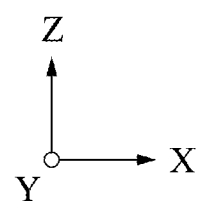

NANOWIRE STACK GAA DEVICE WITH SELECTABLE NUMBERS OF CHANNEL STRIPS

BACKGROUND

Complementary metal oxide semiconductor (CMOS) transistors are building blocks for integrated circuits. Faster CMOS switching speed requires higher drive current, which drives the gate lengths of CMOS transistors down. Shorter gate lengths lead to undesirable "short-channel effects," in which the current control functions of the gates are compromised. FinFET transistors have been developed to, among other things, overcome the short-channel effects. As a further step toward improving electrostatic control of the channels, transistors having wrapped-around gates have been developed, in which a gate portion may surround a semiconductor channel or channel strip from the upper surface and sidewalls thereof.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

FIGS. 3-10 show views of a wafer in various fabrication stages under the example process of FIG. 2;

DETAILED DESCRIPTION

Figure 1:
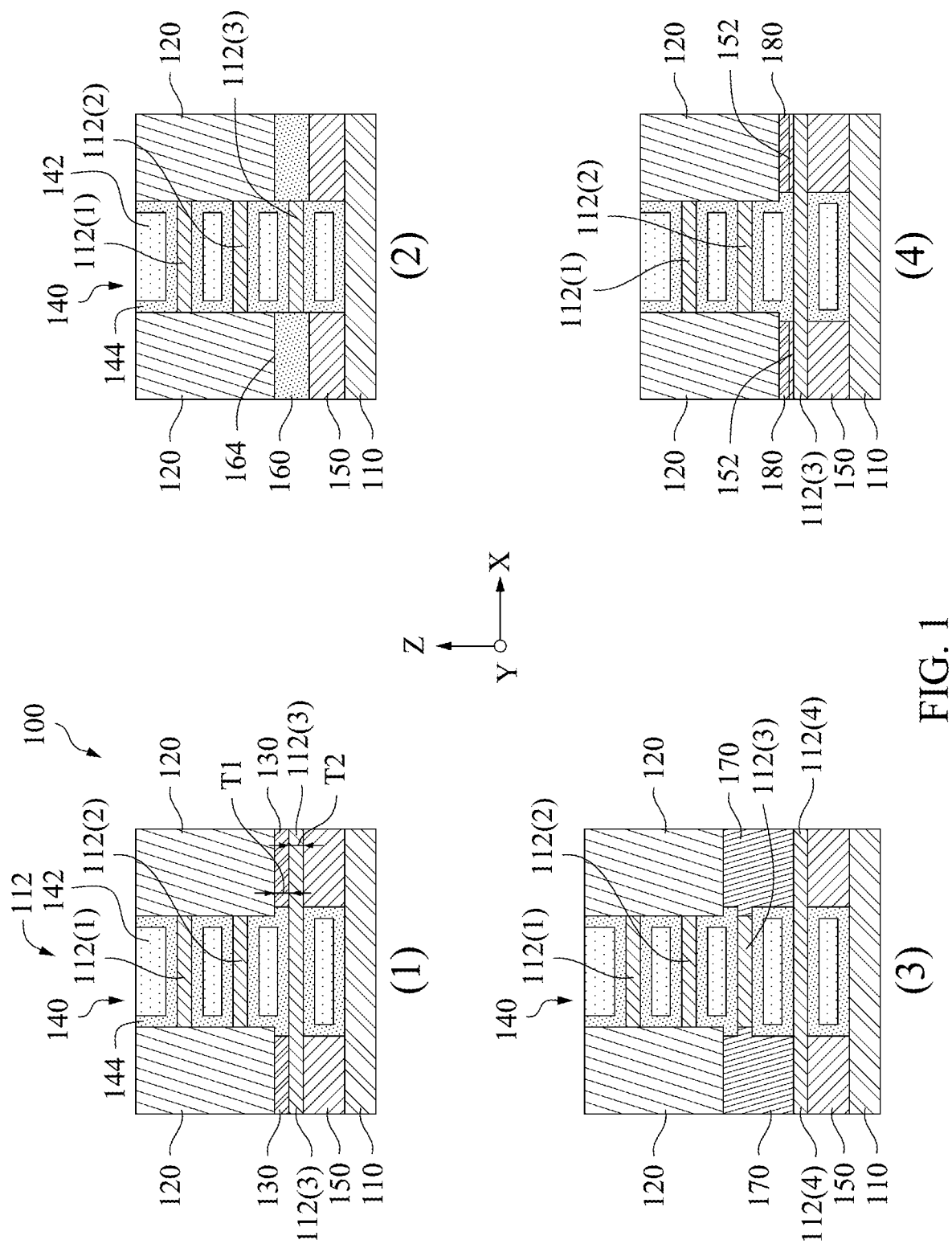
FIG. 1 show embodiment of a device according to example embodiments of the disclosure.

The current disclosure describes techniques for individually selecting the number of nanosheet or nanowire channel strips for a device without changing the structural integrity of the device or adjacent devices. For a device, the channel strips are selected by defining a three-dimensional active region that includes a surface active area and a depth/height. The active region includes semiconductor nanosheet or nanowire strips that are selected as channel strips for the device. That is, for each device, the active region extends from the top surface of a stack of semiconductor nanosheets or nanowires downwardly until a certain depth is reached. A semiconductor nanosheet or nanowire strip contained in the active region will be configured to be a channel strip. A semiconductor nanosheet or nanowire strip not included in the active region, e.g., positioned lower than the active region, is not selected as a channel strip for the device, and is referred to as "non-selected semiconductor strip". For example, a trench is formed beside the active region and having a depth larger than the depth/height of the active region. An auxiliary buffer layer is formed over the bottom surface of the recess to cover the non-selected semiconductor strips in the recess. One or more of the auxiliary buffer layer or the non-selected semiconductor strip(s) is doped to have a different doping type, N-type or P-type, from that of the source/drain of the device. For example, if the device is designed to be an N-type device, the source/drain of the device is doped as N-type and the auxiliary buffer layer or the non-selected semiconductor strip is doped as P-type. The source/drain structure of the device is formed in the recess to contact the channel strips included in the active region. The source/drain structure in the recess is separated from the non-selected semiconductor strips by the auxiliary buffer layer. The additional resistance of the auxiliary buffer layer and the depletion effect of the P-N junction between the source/drain structure and the auxiliary buffer layer prevent leakage current from flowing through the non-selected semiconductor strip(s). The gate structure is formed wrapping around the channel strips in the active region. Using the disclosed technique, the number of channel strips of a device is selected without a semiconductor strip being etched out. As such, the structural integrity of the device is not sacrificed by the channel selection.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a buffer layer is formed over a substrate and patterned using a photolithography process. Spacers are formed alongside the patterned buffer layer using a self-aligned process. The buffer layer is then removed, and the remaining spacers may then be used to pattern the GAA structure.

FIG. 1 shows in cross-sectional views of four embodiments (1), (2), (3) and (4) of a device 100. Referring to embodiment (1), the device 100 includes a substrate 110, e.g., a silicon substrate or other element semiconductor substrate or compound semiconductor substrate or other suitable substrates. The device 100 includes a vertical stack of a plurality of semiconductor nanosheet or nanowire strips ("semiconductor strips") 112(1), 112(2), 112(3). In an embodiment, a nanowire has a substantially circular cross-sectional shape with a diameter ranging between about 2 and about 15 nm. A nanosheet has a rectangular cross-sectional shape with a height ranging between about 2 nm to about 10 nm and a width ranging between about 4 nm to about 50 nm. In the description herein, a semiconductor strip is used to generally refer to a discrete semiconductor layer, e.g., a sheet or a wire, that is separated from other semiconductor layers either vertically or laterally adjacent to the discrete semiconductor layer. A channel region of the device 100 may include an arrangement of multiple semiconductor strips 112 in the lateral orientation and/or multiple semiconductor strips in the vertical orientation. FIG. 1(1) shows the semiconductor strips 112 in the vertical orientation, which does not necessarily mean that the device 100 only includes one vertical stack of semiconductor strips 112. In an embodiment, the semiconductor strips 112(1), 112(2), 112(3) are silicon, silicon germanium, germanium, germanium-tin or other semiconductor materials suitable to function as a channel region of the device 100.

A source/drain structure 120 contacts the upper two semiconductor strips 112(1), 112(2) and is separated from the lower semiconductor strip 112(3) by an auxiliary buffer layer 130. The auxiliary buffer layer 130 is either a semiconductor material that is different from the semiconductor material of the semiconductor strip 112(3) or is a dielectric material. In an embodiment, one or more of the auxiliary buffer layer 130 or the semiconductor strip 112(3) is doped with a different doping type from that of the source/drain structure 120. For example, in a case where the source/drain structure 120 is doped as P-type, one or more of the auxiliary buffer layer 130 is doped as N-type. As such, the P-N junction between the source/drain structure 120 and the auxiliary buffer layer 130 will form a depletion region which prevents further flow of charge carriers therethrough. In an embodiment, a thickness T1 of the auxiliary buffer layer 130 may be selected to be sufficiently large to block the current flow, independent of a thickness T2 of the semiconductor strip 112(3).

In an embodiment, the channel strips 112(1), 112(2) are not doped, e.g., including intrinsic semiconductor materials. In another embodiment, the channel strips 112(1), 112(2) are doped with a different type from that of the source/drain structure 120 to form an inversion-mode device. In a further embodiment, the channel strips 112(1), 112(2) are doped with a same doping type as the source/drain structure 120 to form a junctionless device. Other doping configurations are also possible and included in the disclosure.

A gate structure 140 is formed adjacent to the semiconductor strips 112(1), 112(2) that connect to the source/drain structure 120. In an embodiment, the gate structure wraps around each of the semiconductor strips 112(1), 112(2). The gate structure includes a metal gate electrode 142 and a high-K gate dielectric layer 144. In an embodiment, the gate structure 140 is also adjacent to the semiconductor strip 112(3), although the auxiliary buffer layer 130 prevents current from flowing through the semiconductor strip 112(3) due to the increased resistance brought about by the auxiliary buffer layer 130 and/or due to the depletion effect of the P-N junction.

As such, the semiconductor strips 112(1), 112(2) are configured as channel strips for the device 100 and the semiconductor strip 112(3) is not selected as a channel strip. In embodiment (1), the non-selected semiconductor strip 112(3) extends below the source/drain structure 120 and is longer than the channel strips 112(1) or 112(2). That is, the non-selected semiconductor strip 112(3) overlaps the source/drain structure 120 in the vertical orientation.

In an embodiment, a buffer layer 150 is positioned between the lowest semiconductor strip, here 112(3) and the substrate 110. The buffer layer 150 includes a semiconductor material that has etching selectivity to the semiconductor strips 112. For example, in a case that the semiconductor strip 112 is silicon, the buffer layer 150 is silicon germanium.

In another embodiment (2), the non-selected semiconductor strip 112(3) is also receded similarly as the channel strips 112(1), 112(2) and do not extend under the source/drain structure 120. An auxiliary buffer layer 160 is formed below the source/drain structure 120 and laterally adjacent to the non-selected semiconductor strip 112(3). Specifically, the auxiliary buffer layer 160 laterally covers an edge 162 of the non-selected semiconductor strip 112(3). An upper surface 164 of the auxiliary buffer layer 160 is higher than the non-selected semiconductor strip 112(3) with respect to the substrate 110. The auxiliary buffer layer 160 is a dielectric material or a semiconductor material that is different from the buffer layer 150.

In a further embodiment (3), two upper semiconductor strips 112(1), 112(2) are connected to the source/drain structure 120 and are configured as channel strips and two lower semiconductor strips 112(3) and 112(4) are not selected as channel strips and are separated from the source/drain structure 120 by an auxiliary buffer layer 170. An upper one, 112(3), of the two non-selected semiconductor strips 112(3), 112(4) is receded and covered by the auxiliary buffer layer from a laterally orientation. A lower one, 112(4), of the two non-selected semiconductor strips 112(3), 112(4) is not receded and is covered by the auxiliary buffer layer from at least from the vertical orientation.

In a further embodiment (4), the source/drain structure 120 is separated from the non-selected semiconductor strip 112(3) by more than one buffer layer, here the auxiliary buffer layer 180 and another buffer layer 152. The buffer layer 152 may have a same material as the buffer layer 150. The auxiliary buffer layer 180 includes a dielectric material or a semiconductor material different from that of the buffer layer 152.

FIGS. 1(1), 1(2), 1(4) show that one non-selected semiconductor strip 112(3), which does not limit the scope of the disclosure. A device 100 may include more than one non-selected semiconductor strips in the vertical orientation. The auxiliary buffer layer 130, 160, 180 may be formed over the topmost non-selected semiconductor strip. The multiple non-selected semiconductor strips may include one or more receded semiconductor strips over one or more non-receded semiconductor strips. The auxiliary buffer layer 170 of FIG. 1(3) may laterally cover the receded non-selected semiconductor strips and cover the topmost non-receded semiconductor strip that is not selected to be a channel strip, similarly as shown in FIG. 1(3).

The embodiments of FIG. 1 show that the gate structure 140 is substantially at a same level with the source/drain structure 120, which is not limiting. The gate structure 140 may extend upwardly higher than the source/drain structure 120.

For simplicity purposes, FIG. 1 does not show inner space structures between the gate structure 140 and the source/drain structure 120. It should be appreciated that depending on device designs, an inner spacer structure may be included, which is included in the disclosure.

The substrate 110 may include a silicon substrate in crystalline structure and/or other elementary semiconductors like germanium. Alternatively or additionally, the substrate 110 may include a compound semiconductor such as silicon carbide, gallium arsenide, indium arsenide, and/or indium phosphide. Further, the substrate 110 may also include a silicon-on-insulator (SOI) structure. Substrate 110 may include an epitaxial layer and/or may be strained for performance enhancement. The substrate 110 may also include various doping configurations depending on design requirements such as P-type substrate and/or N-type substrate and various doped regions such as P-wells and/or N-wells.

The gate structure 140 is a high-K metal gate or other suitable gate structures. The following description lists examples of materials for the gate structure 140 including the gate electrode 142 and the gate dielectric layer 144, which are non-limiting. The gate electrode 142 includes a conductive material, e.g., a metal or a metal compound. Suitable metal materials for the gate electrode 142 include ruthenium, palladium, platinum, tungsten, cobalt, nickel, and/or conductive metal oxides. In some examples, the gate electrode 142 includes a work function adjustment layer tuned to have a proper work function for enhanced performance of the field effect transistor devices. For example, suitable N-type work function adjustment metals include Ta, TiAl, TiAlN, TaCN, other N-type work function metal, or a combination thereof, and suitable P-type work function adjustment metal materials include TiN, TaN, other P-type work function metal, or combination thereof. In some examples, a conductive layer, such as an aluminum layer, a copper layer, a cobalt layer or a tungsten layer is formed over the work function adjustment layer such that the gate electrode 142 includes a work function adjustment layer disposed over the gate dielectric layer 144 and a conductive layer disposed over the work function layer and below a gate cap (not shown for simplicity). In an example, the gate electrode 142 has a thickness ranging from about 5 nm to about 100 nm depending on design requirements.

In example embodiments, the gate dielectric layer 144 includes an interfacial silicon oxide layer (not separately shown for simplicity), e.g., thermal or chemical oxide having a thickness ranging from about 5 to about 10 angstrom (Å). In example embodiments, the gate dielectric layer 144 further includes a high dielectric constant (high-K) dielectric material selected from one or more of hafnium oxide ($HfO_2$), hafnium silicon oxide (HfSiO), hafnium silicon oxynitride (HfSiON), hafnium tantalum oxide (HMO), hafnium titanium oxide (HMO), hafnium zirconium oxide (HfZrO), combinations thereof, and/or other suitable materials. A high K dielectric material, in some applications, includes a dielectric constant (K) value larger than 6. Depending on design requirements, a dielectric material of a dielectric contact (K) value of 7 or higher is used. The high-K dielectric layer may be formed by atomic layer deposition (ALD) or other suitable technique. In accordance with embodiments described herein, the high-K dielectric layer of the gate dielectric layer 144 includes a thickness ranging from about 10 to about 30 angstrom (Å) or other suitable thickness.

Figure 2:
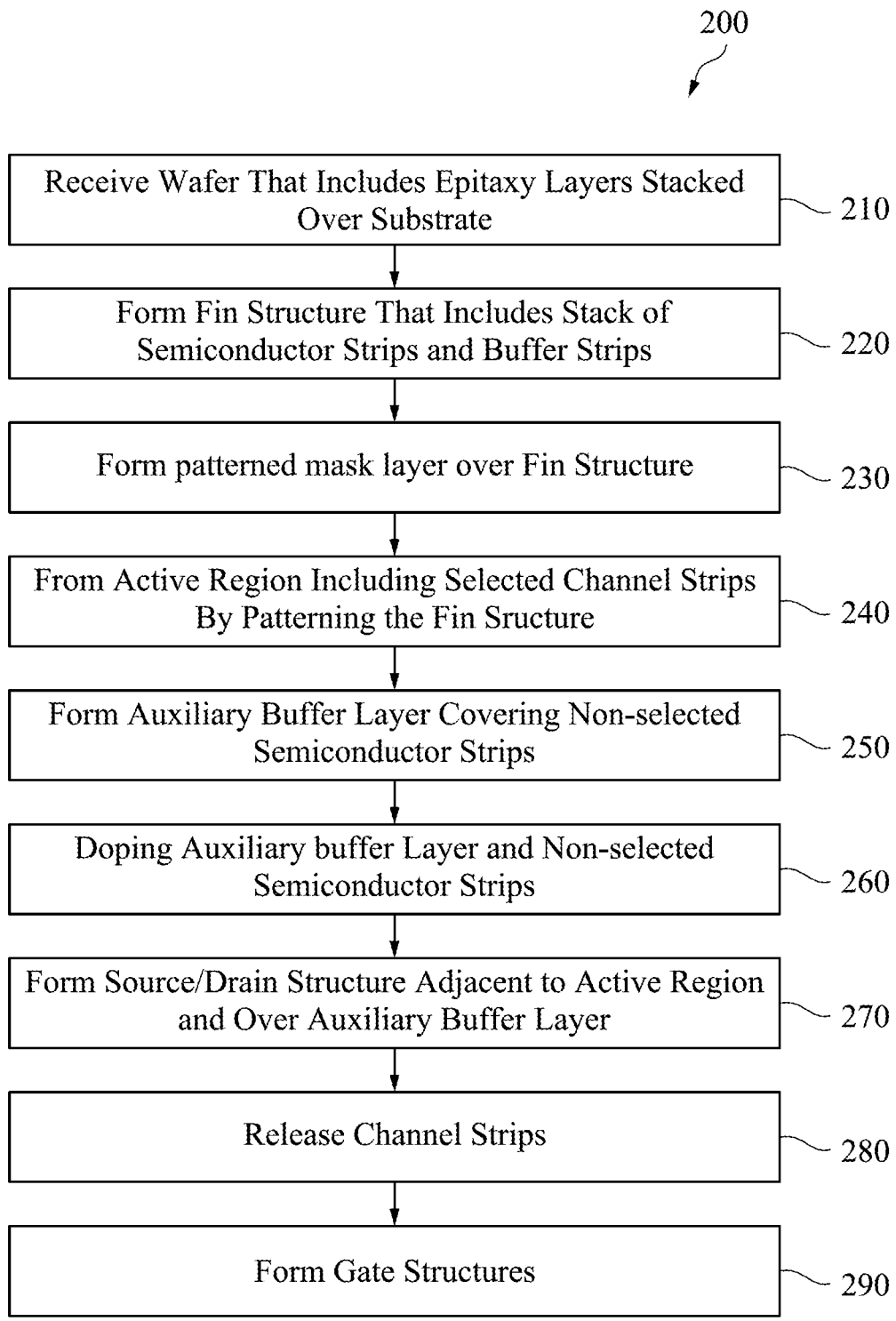
FIG. 2 is an example process according to example embodiments of the disclosure.

FIG. 2 is an example fabrication process 200, which could be used to make the example device 100 shown in FIG. 1, and other devices. FIGS. 3-10 show stages of a wafer 300 in a process of making the example device 100. At each stage, one or more of three views of the wafer 300 are shown, i.e., the perspective view referenced with letter "A," a sectional view from cutting line B-B, referenced with letter "B" and also referred to as "B" plane (X-Z plane), and a sectional view from cutting line C-C, referenced with letter "C" and also referred to as "C" plane. At some of the stages, only one view of the wafer 300 is shown and the reference letter of the respective view will be omitted for simplicity. In some figures, a top plane view is used to substitute for a perspective view for simplicity purposes and the letter "A" is also used to denote the top plane view.

In the description herein, the z-axis orientation is also referred to as a vertical orientation and an x-y plane orientation is also referred to as a lateral orientation for descriptive purposes.

Referring to FIG. 2, with reference also to FIGS. 3A-3C, in example operation 210, a wafer 300 is received. FIGS. 3A-3C illustrate the wafer 300.

The wafer 300 includes a substrate 110, e.g., of silicon, silicon germanium, and/or other suitable semiconductor materials. For example, the substrate 110 may include a compound semiconductor such as silicon carbide, gallium arsenide, indium arsenide, and/or indium phosphide. Further, the substrate 110 may also include a silicon-on-insulator (SOI) structure.

A vertical stack of epitaxial layers 312, 314 of different materials are formed over the substrate 110 and are stacked in an alternating sequence, i.e., each epitaxial layer 312, 314 is immediately and vertically adjacent to a different one of the epitaxial layers 314, 312. FIGS. 3A-3C show, as an illustrative example, that a total of four epitaxial layers 312 and three epitaxial layers 314 are stacked over the substrate 110, which is not limiting. Other numbers of the epitaxial layers 312, 314 are also possible and included in the disclosure. In an embodiment, the wafer 300 includes a same number of the epitaxial layers 312 as the epitaxial layers 314. In another embodiment, the wafer 300 includes a different number of the epitaxial layers 312 from that of the epitaxial layers 314.

The epitaxial layers 312 are formed of a first semiconductor material and the epitaxial layers 314 are formed of a second semiconductor material different from the first semiconductor material. In an embodiment, the first semiconductor material and the second semiconductor material have different etching rates with respect to some etchants, i.e., having etching selectivity, such that a selective etching may be conducted to remove one of the epitaxial layers 312, 314 with the other one remaining. In an embodiment, the epitaxial layer 312 is silicon germanium of $Si_xGe_{1-x}$, with x being greater than 0 and smaller than 1, and in some embodiments between about 0.4 and about 0.9. For example, in an embodiment, x=0.8 and the epitaxial layer 312 is $Si_{0.8}Ge_{0.2}$. In an embodiment, the epitaxial layer 314 is silicon.

The epitaxial layers 312, 314 each may be doped in various approaches with various dopants/impurities, such as arsenic, phosphorous, boron, gallium, indium, antimony, oxygen, nitrogen, or various combinations thereof.

In an embodiment, the epitaxial layers 312, 314 are sheets of nanowire silicon germanium or nanowire silicon, respectively, and are referred to as nanosheets 312, 314. Each of the nanosheets 312, 314 may have a thickness between about 4 nm to about 20 nm. In some embodiment, the nanosheets 312, 314 each may have a thickness between about 5 nm to about 8 nm.

The epitaxial layers 312, 314 may also be other semiconductor materials.

Epitaxial layers 312, 314 may be formed using the vapor-liquid-solid (VLS) technique or other suitable growth procedures. In the description herein, the nanosheets 314, 312 of 1-D nanowire silicon or silicon germanium, respectively, are used as illustrative examples in the description of the disclosure.

The nanosheets 312, 314 may be globally formed over the substrate 110 or may be locally formed over the substrate 110. In a local formation procedure, the nanosheets 312, 314 are formed within an area defined by shallow trench insulation (STI) regions and/or are formed over a doped substrate region, e.g., a P-well or an N-well.

Figure 4B:
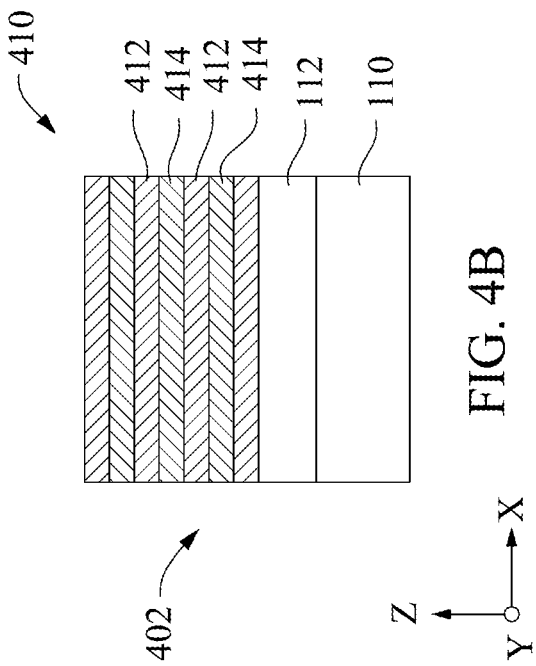
Figure 4C:
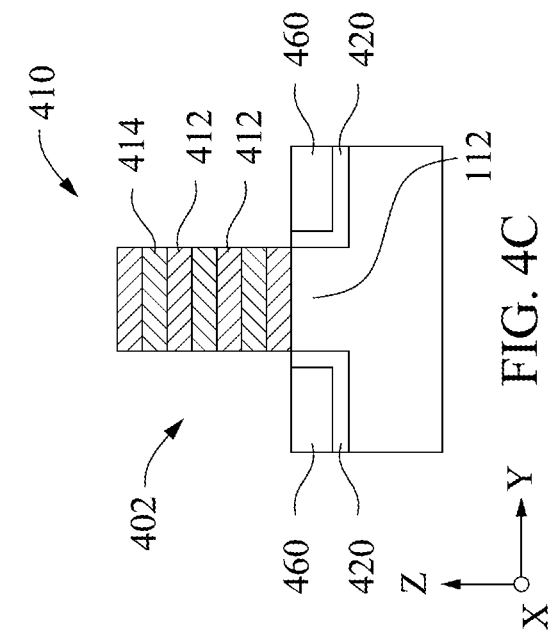
Figure 4A:
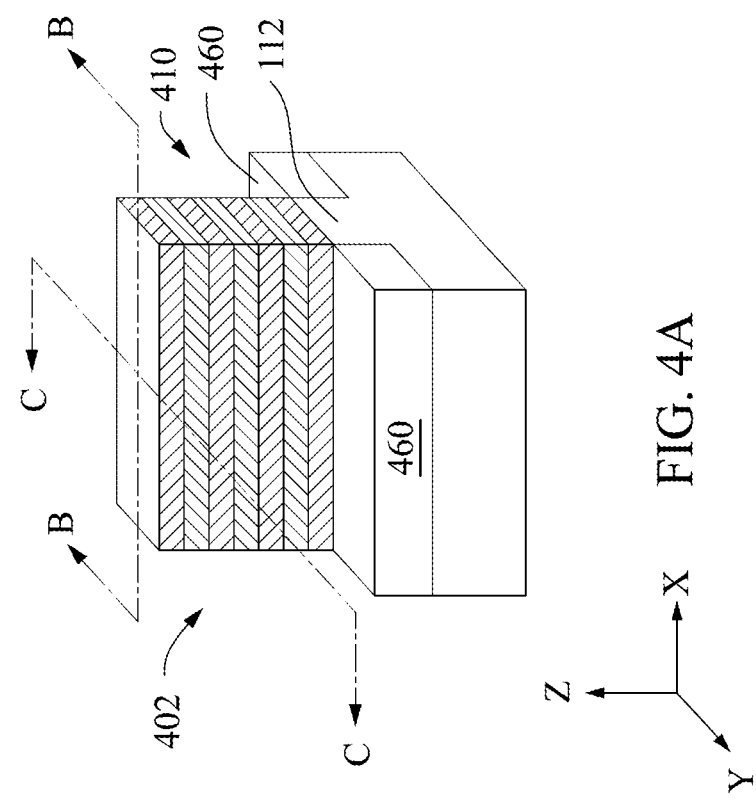

Referring back to FIG. 2, with respect also to FIGS. 4A-4C, in example operation 220, fin structures 402 are formed by patterning the wafer 300. Any suitable patterning procedures may be used and all are included in the disclosure. The fin structure 402 includes two portions, an upper portion 410 and a 111. The lower portion 111 is formed from patterning the substrate 110, e.g., of silicon, and is also part of the substrate 110 and is referred to as the "substrate" or the "lower fin portion" or the "lower portion" of the fin, as scenarios apply. The upper portion 410 is formed from patterning the stacked epitaxial layers 312, 314. In the example case that the epitaxial layers 312, 314 are nanosheets, the upper fin portion 410 include nanowire silicon germanium strips 412, and nanowire silicon strips 414 vertically stacked in an alternating manner. The upper fin portion 410 including the stack of the nanowire strips 412, 414 is also referred to as nanowire stack 410. Note that the nanowire stack 410 is different from the nanowire stack 112 of device 100 shown in FIGS. 1A-1C because one group of the nanowire strips 412, 414 will be removed as buffer strips, as described herein.

In the following fabrication stages, either the nanowire strips 412 or the nanowire strips 414 will be removed from the nanowire stack 410 and are referred to as the "buffer strips". The nanowire strips 412, 414 that remain on the nanowire stack 410 are referred to as the "semiconductor nanowire strips." As illustrative examples, the silicon germanium nanowire strips 412 are removed as buffer strips and the silicon nanowire strips 414 remain to eventually become the nanowire structures 122 of the nanowire stack 112 of device 100.

An insulation layer 460 is formed over the substrate 110 and adjacent to the fin structures 402, as shown in FIG. 4A (in FIG. 4A, a portion of the insulation layer 460 is omitted for illustrative purposes) and FIG. 4C. In an embodiment, the insulation layer 460 is silicon oxide or other suitable dielectric material. In some embodiments, an etch stop layer 420 is formed between the insulation layer 460 and the substrate 110 including the lower portion 111 of the fin structure 402. The etch stop layer 420 is a different dielectric material from the insulation layer 460. In an embodiment, the etch stop layer 420 is silicon nitride or other suitable dielectric material. In an embodiment, the insulation layer 460 and the etch stop layer 420 are adjacent only to the lower portion 111, and the upper fin portion 410 is exposed from the insulation layer 460 and the etch stop layer 420.

Figure 5C:
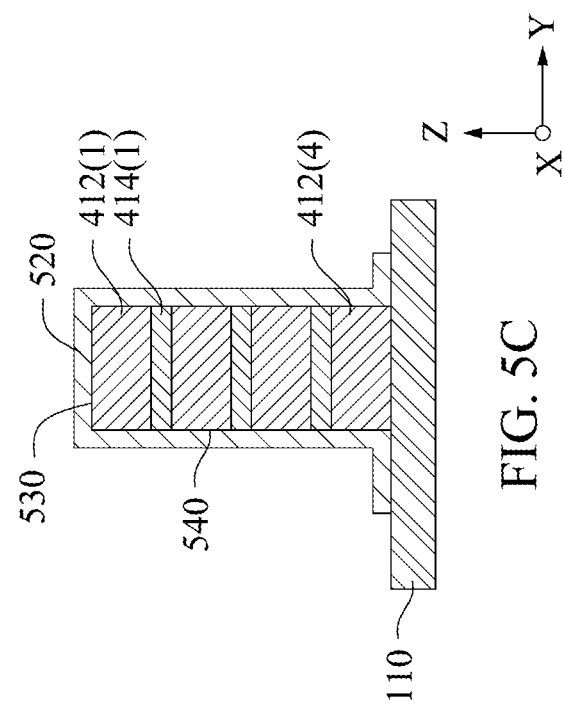
Figure 5A:
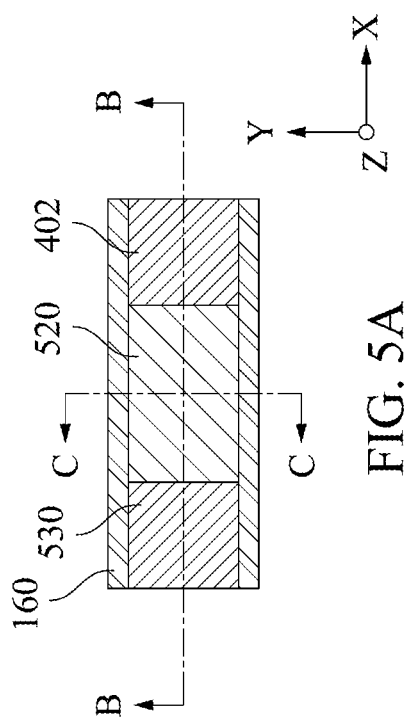
Figure 5B:
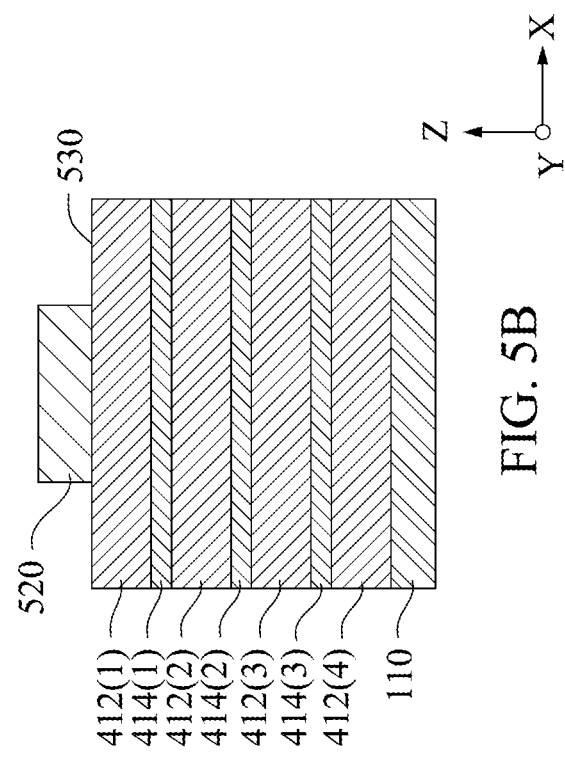

In example operation 230, with reference also to FIGS. 5A-5C, a patterned mask layer 520 is formed and patterned over the fin structure 402. In an embodiment, the patterned mask layer 520 overlaps a part of a top surface 530 of the upper fin portion 410, a sidewall 540 of the fin structure 402 and the insulation layer 460 (if any) or the substrate 110. The patterned mask layer 520 is silicon oxide, silicon nitride or other suitable dielectric or conductive material.

In example operation 240, with reference also to FIG. 6, an active region 620 is formed by patterning the upper fin portion 410 by anisotropic etching. In an embodiment, the active region 620 is firmed or defined as a three-dimensional region. Specifically, the active region 620 is defined to have an active area 622 and a depth/height 624. The depth/height 624 may be referred to as a depth with respect to a downward orientation and may be referred to as a height with respect to an upward orientation. The active area 622 is a two-dimensional top surface area 622 of the of the upper fin portion 410 that is covered by the patterned mask layer 520. In an embodiment, the depth/height 624 is selected based on a number of channel strips of a device to be formed over the active region 620. For example, as shown in FIG. 6B, in a scenario that a device design stipulates two channel strips, the depth/height 624 is determined to extend from the surface area 622 downward beyond two silicon strips 414 counting from the top of the upper fin portion 410, here 414(1), 414(2), and end at or below an interface 628 between the second silicon strip 414(2) and the third buffer strip 412(3). That is, the selection of the number of channels for a device starts from the top surface of the active region 620. In the description herein, the semiconductor strips 414 selected to function as a channel are referred to as "selected channel strips" 414 and the semiconductor strips not selected to function as a channel are referred to as "non-selected semiconductor strips" 414. The selected channel strips 414 and the non-selected semiconductor strips include a same semiconductor material. The buffer strip 412 includes a different material from that of the selected channel strips and the non-selected semiconductor strips.

The anisotropic etching forms recess 625 and ends at an etch end surface 626, which in some embodiments, is a bottom surface of a recess formed by the anisotropic etching. The etch end surface 626 is controlled to be lower than the depth 624 of the active region. In some embodiment, the etch end surface 626 is controlled to be lower than the depth 624 by a threshold depth. The threshold depth is determined based on an auxiliary buffer layer to be formed over the etch end surface 626.

FIG. 6B shows that the anisotropic etching reaches an etch end surface 626 that is part of the third silicon strip 414(3). That is, the third buffer strip 412(3) is fully patterned and does not extend laterally beyond the active area 622. FIG. 6B(i) shows that the anisotropic etching reaches an etch end surface 626 that is part of the third buffer strip 414(3). That is, the third buffer strip 412(3) is partially patterned and a portion 627 of the partially patterned third buffer strip 412(3) extends beyond the active area 622. That is, the etching does not expose the third silicon strip 414(3).

In some further embodiments, the etching may intentionally or unintentionally reach downward beyond the third buffer strip 412(3). For example, as shown in FIG. 6B(ii), the anisotropic etching reaches all the way to the fourth buffer strip 412(4) and patterns the third silicon layer 414(3). That is, the etch end surface 626 is part of the fourth buffer layer 412(4).

Figure 7A:
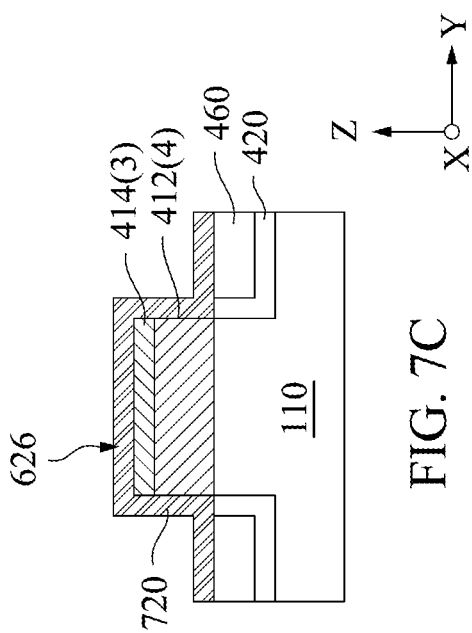
Figure 7C:
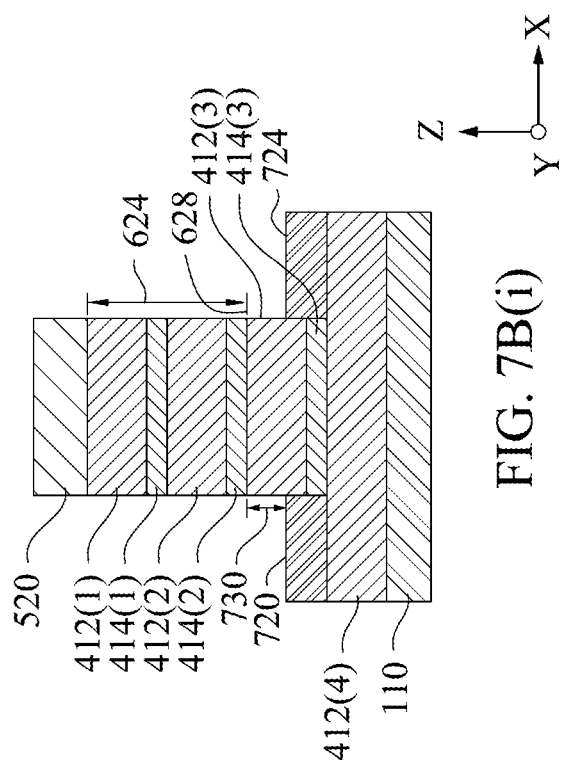
Figure 7B:
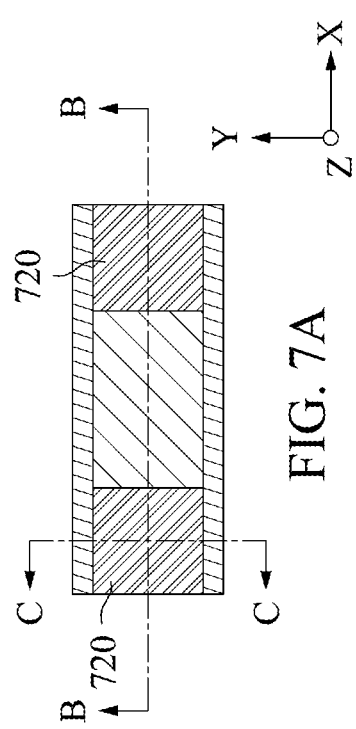
Figure 7B:
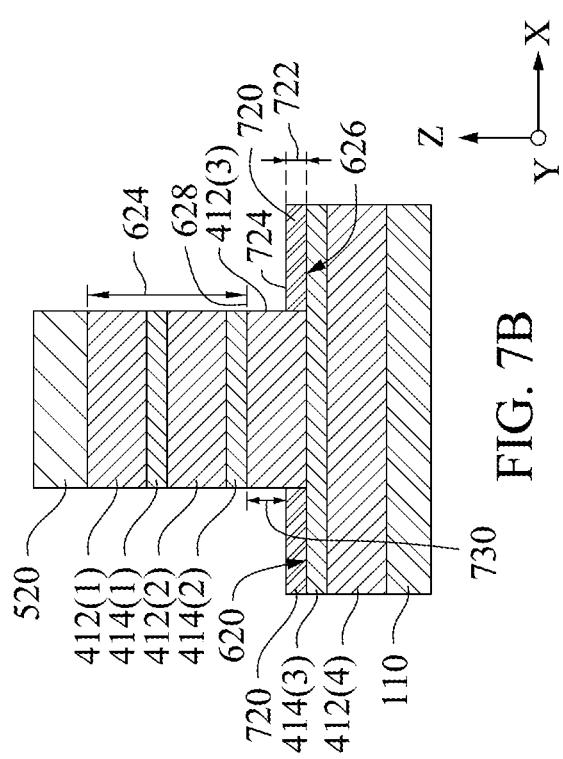

In example operation 250, with reference also to FIGS. 7A-7C, an auxiliary buffer layer 720 is formed over the etch end surface 626. In an embodiment, the auxiliary buffer layer 720 functions to provide additional buffering to overlap the non-selected semiconductor strip 414(3). In an embodiment, the auxiliary buffer layer 720 has a thickness 722 that is larger than a threshold such that the auxiliary buffer layer 720 laterally covers the non-selected semiconductor strip 414(3) in a scenario that the non-selected semiconductor strips 414(3) are laterally exposed by the recess 625 as shown in FIG. 6B(ii). FIG. 7B(i) shows a scenario that the auxiliary buffer layer 720, e.g., of silicon oxide or a low-k dielectric material, is formed to laterally cover the non-selected semiconductor strip 414(3) exposed from the recess 625. For example, the auxiliary buffer layer 720 has a thickness 722 ranging from about 10 nm to about 100 nm. In an embodiment, the thickness 722 is about 5 nm to about 20 nm.

In an embodiment, an upper surface 724 of the auxiliary buffer layer 720 is lower than or substantially at a same level as the lower end 628 of the active region 620. In an embodiment, a gap 730 between the upper surface 724 and the lower end 628 of the active region 620 is maintained to avoid leakage current as will be further described herein.

The auxiliary buffer layer 720 may be a semiconductor material similar to the buffer strips 414, e.g., $Si_{0.8}Ge_{0.2}$, a third semiconductor material different from the buffer strips 414 or the silicon strips 412, e.g., silicon carbide, or may be a dielectric material, e.g., a low-k dielectric material. The auxiliary buffer layer 720 of a semiconductor material may be formed through an epitaxial process or other suitable deposition processes. The auxiliary buffer layer 720 of a dielectric material may be formed by a chemical vapor deposition ("CVD") process or other suitable deposition processes.

In an alternatively embodiment, in a case that a portion of the third buffer layer 412(3) remains over the non-selected semiconductor strip 414(3), i.e., the non-selected semiconductor strip 414(3) is not exposed by the anisotropic etching of the operation 240, the auxiliary buffer layer 720 may not be formed.

In the description herein, the auxiliary buffer layer 720 of $Si_{0.8}Ge_{0.2}$ formed over the non-selected semiconductor strip, i.e., the third silicon strip 414(3), is used as an illustrative example.

In the example of FIG. 7B, only one silicon strip, i.e., the third silicon strip 414(3), is not selected as a channel strip. In other scenarios, more than one semiconductor strip 414 may be not selected as channel strips. The auxiliary buffer layer 720 is formed over or has a thickness sufficiently larger to cover the highest level non-selected semiconductor strip 414. The "highest" level is referred to with respect to the substrate 110.

In example operation 260, the auxiliary buffer layer 720 and the non-selected semiconductor strip 414(3) are doped with a first type of dopants. In an embodiment, the doping type of the auxiliary buffer layer 720 and the non-selected semiconductor strip 414(3) are different from the source/drain structure of the device. For example, for a P—type device, the source/drain structure will include P type materials while the auxiliary buffer layer 720 and the non-selected semiconductor strip 414(3) are doped with N-type dopants. For an N-type device, the source/drain structure will include N type materials while the auxiliary buffer layer 720 and the non-selected semiconductor strip 414(3) are doped with P-type dopants. The P-type dopants may include boron B, gallium Ga, aluminum Al, indium In or other suitable P-type dopants. The N-type dopants may include phosphorus P, arsenic As, antimony Sb or other suitable N-type dopants. The energy of the ion implantation may be in a range between about 0.1 keV to about 10 MeV. The dose rate of ion implantation may be in a range between about $1*10^{11}$ ions $cm^{-2}$-$1*10^{17}$ ions $cm^{-2}$.

In an alternative embodiment, the auxiliary buffer layer 720 and the non-selected semiconductor strip 414(3) are not doped or are unintentionally doped.

FIGS. 8-10 show the B plane view of the wafer 300 in the various fabrication stages.

In example operation 270, a source/drain structure is formed adjacent to the active region 620. FIG. 8 shows a B plane view of the wafer 300 with the source/drain structure 820 formed. As shown in FIG. 8, the source/drain structure 820 is formed over the upper surface 724 of the auxiliary buffer layer 720. As such, the auxiliary buffer layer 720 separates the source/drain structure 820 from the non-selected semiconductor strip 414(3). The auxiliary buffer layer 720 provides additional resistance which prevents the charge carrier from flowing through the non-selected semiconductor strip 414(3) as compared to the selected channel strips 414(1) and 414(2). Further, in the scenario that the auxiliary buffer layer 720 is doped with a different type from the doping of the source/drain structure 820, a depletion region is formed through the P-N junction at the interface between the auxiliary buffer layer 720 and the source/drain structure 820. The depletion region at the P-N junction interface further prevents the charge carriers from flowing through the non-selected semiconductor strip 414(3) via the auxiliary buffer layer 720.

The materials of the source/drain structure 820 are selected based on the device type, e.g., P-type or n-type and based on the channel material. In the example embodiment the selected channel strips 414(1), 414(2) are silicon, the source/drain structure 820 are silicon carbide SiC, silicon carbon phosphide SiCP, silicon phosphide SiP or other suitable semiconductor materials for an N-type device. For a P-type device, the source/drain structure 820 is silicon germanium SiGe, silicon-germanium-boron SiGeB or other suitable semiconductor materials. The selected channel strips 414(1), 414(2) of silicon are used as an illustrative example which does not limit the scope of the disclosure. For example, for a p-type device, SiGe may be used as the selected channel strips.

The semiconductor regions may be doped in various approaches with various N-type or P-type dopants/impurities, like arsenic, phosphorous, boron, gallium, indium, antimony, oxygen, nitrogen, or various combinations thereof. In an embodiment, the source/drain structures 820 are doped in-situ during the formation of the source/drain structure 820. Example precursors for the in-situ doping include $PH_3$ or $AsH_3$ for the N-type dopants P or As, respectively, and $B_2H_6$ or $GaCl_3$ for the P-type dopants B or Ga, respectively.

The source/drain structure 820 may be formed through an epitaxial process, e.g., physical vapor deposition ("PVD"), chemical vapor deposition ("CVD") or atomic layer deposition ("ALD") or other suitable deposition processes.

In an embodiment, the source/drain structure 820 is formed to have a thickness 822 so that the source/drain structure 820 extends from the upper surface 724 of the auxiliary buffer layer 720 upwardly beyond the highest level or the top one of the selected channel strips, here the selected channel strip 414(1). This thickness 822 is maintained to make sure that the source/drain structure 820 contacts each of the selected channel strips 414(1), 414(2).

As shown in FIG. 8(i), in some embodiment, before the source/drain structure 820 is formed, an inner space structure 830 may be formed outside the buffer strips 412(1), 412(2), 412(3) adjacent to the selected channel strips 414(1), 414(2). The inner spacer structures 830 may provide insulation between the source/drain structure 820 and the gate structure to be formed after the buffer strips 412(1), 412(2), 412(3) are removed. For example, the buffer strips 412(1), 412(2), 412(3) may be selectively etched to create recess regions where the inner spacer structures 830 are formed therein.

In example operation 280, with reference also to FIG. 9, the selected channel strips 414(1), 414(2) are released by removing the buffer strips 412 adjacent to the selected channel strips 414(1), 414(2). For example selective dry etching or wet etching may be used to remove the buffer strips 412. For example, gases $CF_4$, HCl may be used to selectively etch out the buffer layers 412 and form a void 920 surrounding the released channel strips 414(1), 414(2). In an embodiment, the selective etching may also partially release the non-selected semiconductor strip 414(3) as shown in FIG. 9. Further, because the etching is selective to the silicon of the selected channel strips 414(1), 414(2) and the source/drain structure 820 and may be isotropic, the selective etching may form an undercut region 922 below the source/drain structure 820 intentionally or unintentionally. Optionally, a patterned mask layer 924 may be formed to control the dosage of the isotropic selective etching such that the auxiliary buffer layer 720 is not completely removed.

In example operation 290, with reference also to FIG. 10, a gate structure 1010 is formed adjacent to the selected channel strips 414(1), 414(2) and within the void 920. The gate structure 1010 including a gate electrode 1012 and a gate dielectric layer 1014. The gate electrode 1012 includes a conductive material, e.g., a metal or a metal compound. Suitable metal materials for the gate electrode 142 include ruthenium, palladium, platinum, tungsten, cobalt, nickel, hafnium (Hf), zirconium (Zr), titanium (Ti), tantalum (Ta), aluminum (Al), aluminides and/or conductive metal carbides (e.g., hafnium carbide, zirconium carbide, titanium carbide, and aluminum carbide), and other suitable conductive materials. In some examples, the gate electrode 1012 may include a work function adjustment layer tuned to have a proper work function for enhanced performance of the field effect transistor devices. For example, suitable N-type work function adjustment metals include Ta, TiAl, TiAlN, TaCN, other N-type work function metal, or a combination thereof, and suitable P-type work function adjustment metal materials include TiN, TaN, other P-type work function metal, or combination thereof. In an example, the gate electrode 142 has a thickness ranging from about 5 nm to about 40 nm depending on design requirements.

In example embodiments, the gate dielectric layer 1014 includes an interfacial silicon oxide layer (not separately shown for simplicity), e.g., thermal or chemical oxide having a thickness ranging from about 5 to about 10 angstrom (Å). In example embodiments, the gate dielectric layer 1014 further includes a high dielectric constant (high-K) dielectric material selected from one or more of hafnium oxide ($HfO_2$), hafnium silicon oxide (HfSiO), hafnium silicon oxynitride (HfSiON), hafnium tantalum oxide (HMO), hafnium titanium oxide (HMO), hafnium zirconium oxide (HfZrO), combinations thereof, and/or other suitable materials. A high K dielectric material, in some applications, includes a dielectric constant (K) value larger than 6. Depending on design requirements, a dielectric material of a dielectric contact (K) value of 7 or higher is used. The high-K dielectric layer may be formed by atomic layer deposition (ALD) or other suitable technique. In accordance with embodiments described herein, the high-K dielectric layer of the gate dielectric layer 1014 includes a thickness ranging from about 10 to about 30 angstrom (Å) or other suitable thickness.

In an embodiment, the gate structure 1010 wraps around the selected channel strips 414(1), 414(2).

Figure 11:
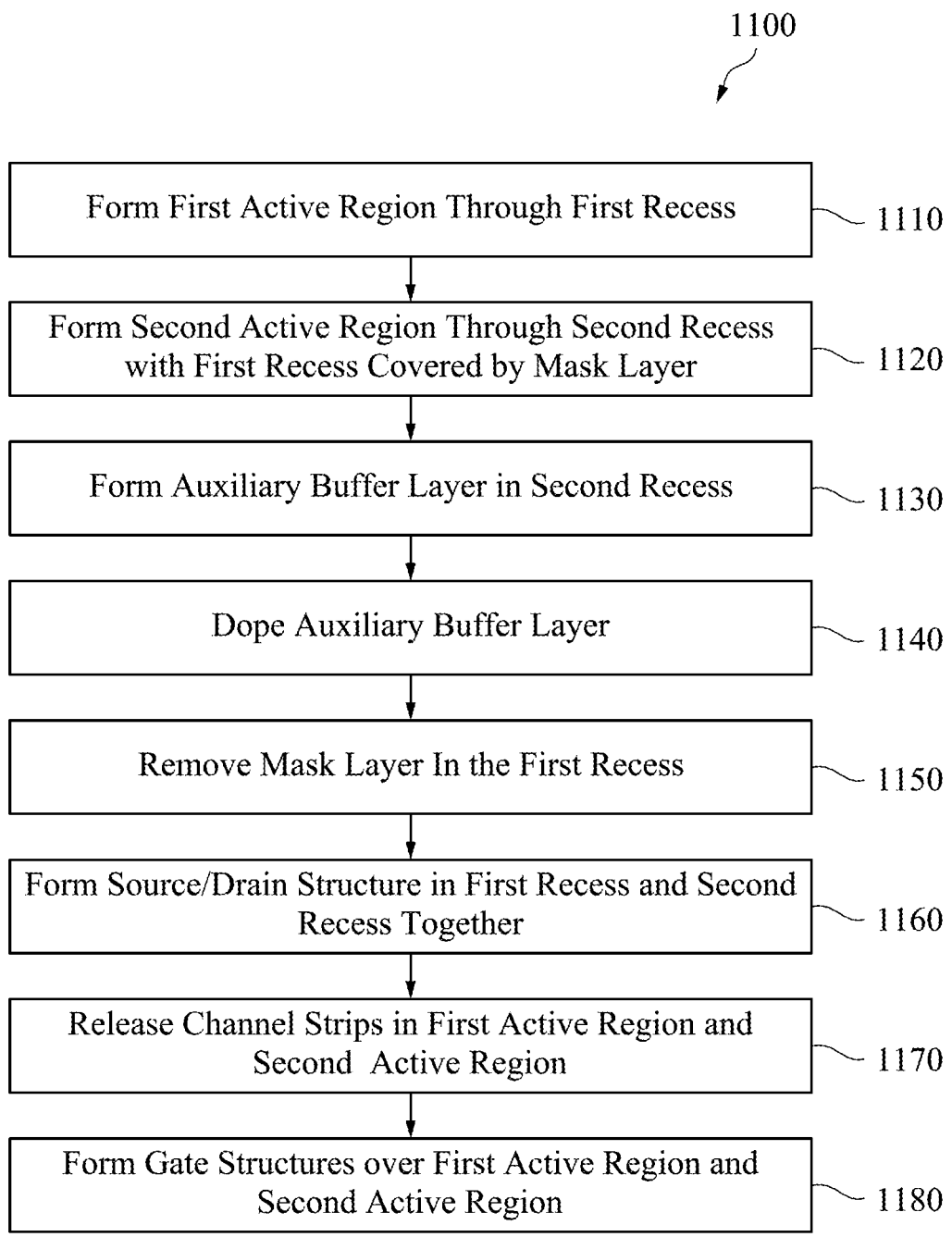
FIG. 11 is another example process according to example embodiments of the disclosure.

FIG. 11 shows another example process 1100. FIGS. 12-18 show, in the B plane cross-sectional view, a wafer 1200 in various stages of fabrication under the example process 1100. At an initial stage, the wafer 1200 may be similar to the wafer 300 having a fin structure 402 formed over a substrate 110 as shown in FIG. 4.

Figure 12:
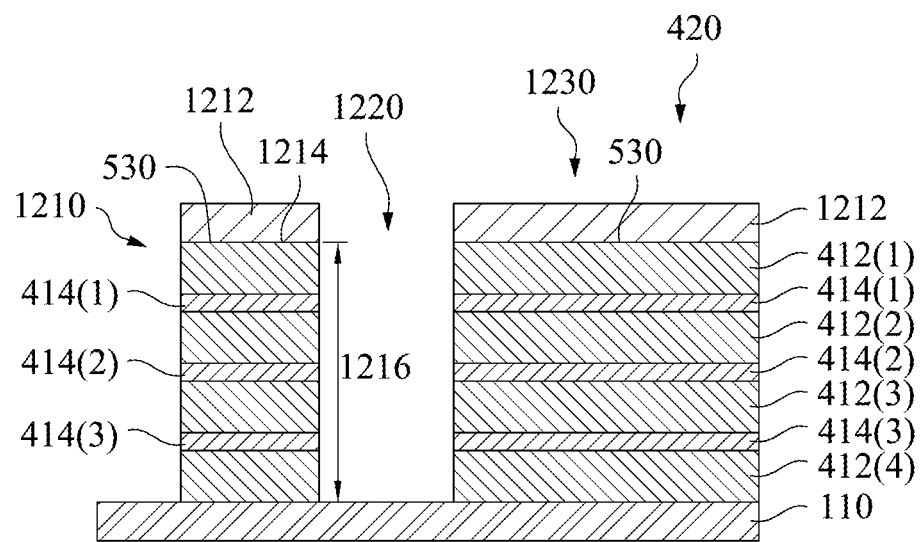
FIGS. 12-18 show views of a wafer in various fabrication stages under the example process of FIG. 11.

Referring to FIG. 11, in example operation 1110, with reference also to FIG. 12, a first active region 1210 is defined for a first device. For example, the first active region 1210 is formed through anisotropic etching with a first patterned mask layer 1212. The first active region 1210 is a three-dimensional region defined by a first active area 1214 at the top surface 530 of the upper fin portion 410 and a first depth/height 1216. The first active region includes three silicon strips 414(1), 414(2) and 414(3) as selected channel strips.

In defining the first active region 1210, a first recess 1220 is formed separating the first active region 1210 from the rest portion 1230 of the fin structure 402. Specifically, the first recess 1220 separates the three selected channel strips 414(1), 414(2) and 414(3) of the first active region 1210 from the rest portion 1230 of the fin structure 402. FIG. 12 shows, as an illustrative example, that the first recess 1220 extends downwardly to the substrate 110, which is not limiting. The first recess 1220 may extend downwardly until a point between the third selected channel strip 414(3) and the substrate 110. In an embodiment, the first recess 1220 extends as deep as or deeper than the first depth/height 1216 of the first active region 1210.

Figure 13:
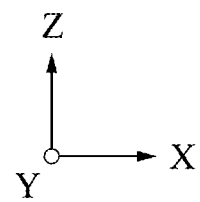
Figure 13:
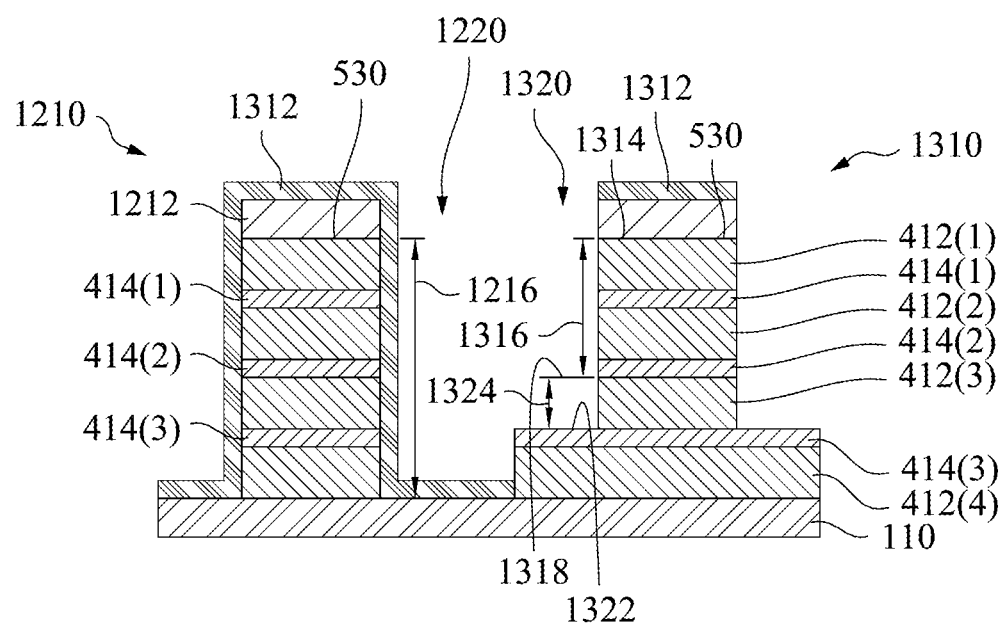

In example operation 1120, with reference also to FIG. 13, a second active region 1310 is defined for a second device. For example, the second active region 1310 is formed through anisotropic etching with a second patterned mask layer 1312. The second active region 1310 is a three-dimensional region defined by a second active area 1314 and a second depth/height 1316. The second active region 1310 includes two silicon strips 414(1), 414(2) counting from the top surface 530 as selected channel strips. The second depth 1316 is smaller than the first depth 1216. The second active region 1310 extends vertically from the top surface 530 to an end point 1318 downward beyond the lowest selected channel strip, here 414(2) and the highest non-selected semiconductor strip, here 414(3).

In defining the second active region 1310, a second recess 1320 is formed immediately adjacent to the first recess 1220. An etch stop surface or bottom surface 1322 of the second recess 1320 is lower than the end point 1318 of the second active region 1310. A gap 1324 between the bottom surface 1322 of the second recess 1320 and the end point 1318 of the second active region 1310 is substantially equal to or larger than a thickness of an auxiliary buffer layer to be formed over the bottom surface 1322.

The channel layers 414(1), 414(2) in the second active region 1310 are each in lateral alignment with the channel layers 414(1), 414(2) in the first active region 1210 because they are formed, e.g., as receded portions, of the same semiconductor strip 414(1), 414(2) of FIG. 4, respectively. Similarly, the non-selected semiconductor strip 414(3) in the second active region 1310 is in lateral alignment with the selected channel strip 414(3) in the first active region 1210.

Figure 14:
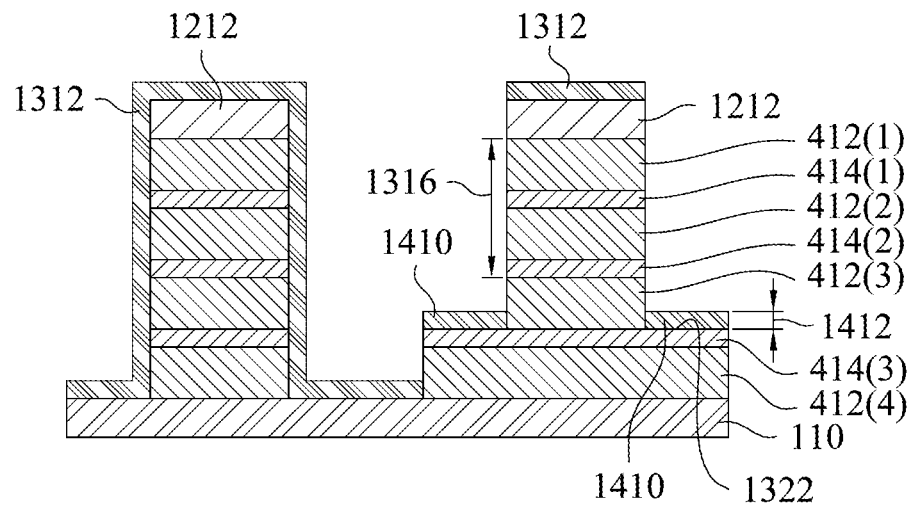

In example operation 1130, with reference also to FIG. 14, an auxiliary buffer layer 1410 is formed over the bottom surface 1322 of the second recess 1320. Specifically the auxiliary buffer layer 1410 provides additional coverage of the highest/top non-selected semiconductor strip 414(3) that is not selected to function as a channel strip for the second device to be formed over the second active region 1310. The auxiliary buffer layer 1410 has a thickness 1412 that is sufficiently large to laterally cover the highest/top non-selected semiconductor strip 414(3). In an embodiment, the thickness 1412 of the auxiliary buffer layer 1410 is larger than a thickness of the highest/top non-selected semiconductor strip 414(3). In an embodiment, the auxiliary buffer layer 1410 does not extend upwardly beyond the end point 1318 (e.g., the lower point) of the height/depth 1316 of the second active region 1310.

In example operation 1140, the auxiliary buffer layer 1410 and the non-selected semiconductor strip 414(3) are doped to form P-N junction with the source/drain structures to be formed within the second recess 1320. For example, for an N-type second device formed over the second active region 1310, the auxiliary buffer layer 1410 and the non-selected semiconductor strip 414(3) are doped with P-type dopants.

In an embodiment, the fourth buffer strip 412(4) adjacent to the non-selected semiconductor strip 414(3) is also doped with the same dopants as the auxiliary buffer layer 1410 and the non-selected semiconductor strip 414(3).

Figure 15:
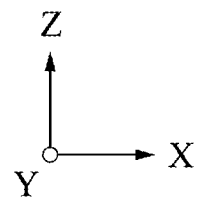
Figure 15:
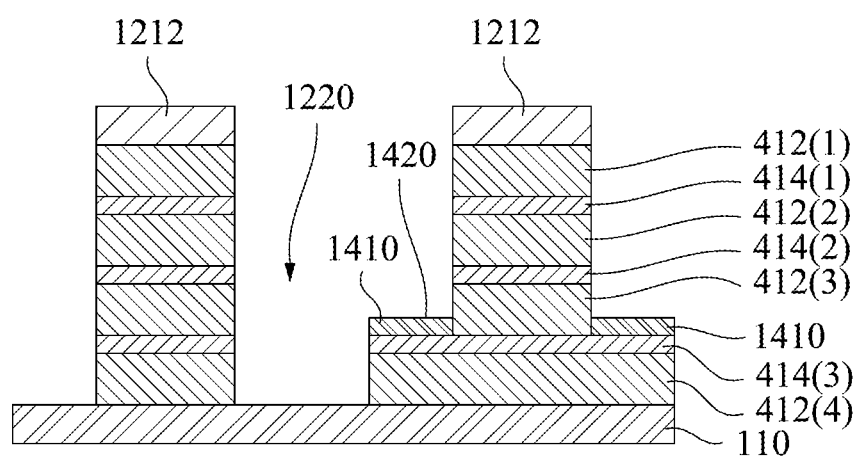

In example operation 1150, with reference also to FIG. 15, the second mask layer 1312 is removed. In an embodiment, the second mask layer 1312 has etching selectivity over the first mask layer 1212 such that a selective etching may remove the second mask layer 1312 while leaving the first mask layer 1212 remaining. For example the first mask layer 1212 or the second mask layer 1312 are silicon oxide or silicon nitride, respectively.

As the auxiliary buffer layer 1410 covers, one or more of vertically or laterally, the third silicon strip 414(3) that is not selected as a channel strip for the second device, an upper surface 1420 of the auxiliary buffer layer 1410 is higher than the third silicon strip 414(3), with respect to the substrate 110. The first recess 1220 is deeper than the third silicon strip 414(3), which is selected as a selected channel strip for the first device. So the upper surface 1420 of the auxiliary buffer layer 1410 is higher than a bottom surface of the first recess 1220, which as illustratively shown in FIG. 12 is the upper surface of the substrate 110.

Figure 16:
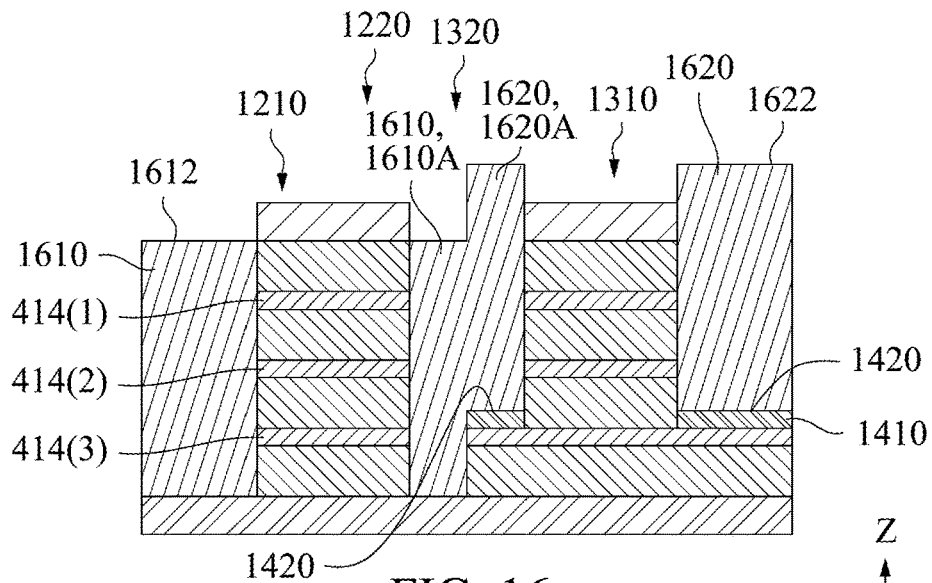

In example operation 1160, with reference also to FIG. 16, first source/drain structures 1610 and second source/drain structures 1620 are formed adjacent to the first active region 1210 or the second active region 1310, respectively. In an embodiment, the first device and the second device are a same type of device and the source/drain structures 1610, 1620 include a same material and are formed in a same deposition process. The first source/drain structure 1610 is formed in the first recess 1220. The second source/drain structure 1620 is formed in the second recess 1320 and over the auxiliary buffer layer 1410.

The first source/drain structure 1610 is formed with a thickness sufficiently large to contact all three selected channel strips 414(1), 414(2), 414(3) of the first active region 1210 for the first device. As such, the first source/drain structure 1610 extends upwardly until a point higher than the topmost/highest selected channel strip 414(1). That is, an upper surface 1612 of the first source/drain structure 1610 is at a level higher than the topmost/highest selected channel strip 414(1). Formed with a same deposition process, an upper surface 1622 of the second source/drain structure 1620 is higher than the upper surface 1612 of the first source/drain structure. As such, the second source/drain structure 1620 also contacts all the selected channel strips 414(1), 414(2) of the second active region for the second device. As the upper surface 1420 of the auxiliary buffer layer 1410 is higher than the bottom surface of the first recess 1220, the upper surface 1622 of the second source/drain structure 1620 is higher than the upper surface 1612 of the first source/drain structure 1610.

The first source/drain structure 1610 and the second source/drain structure 1620 are doped with suitable dopants.

As the first recess 1220 and the second recess 1320 are adjacent to one another between the first active region 1210 and the second active region 1310, the first source/drain structure 1610A is formed contacting the second source/drain structure 1620A. In an embodiment, the adjacent first source/drain structure 1610A and the second source/drain structure 1620A are configured as a same type of source/drain terminal, e.g., either both are source terminals or both are drain terminals.

Figure 17:
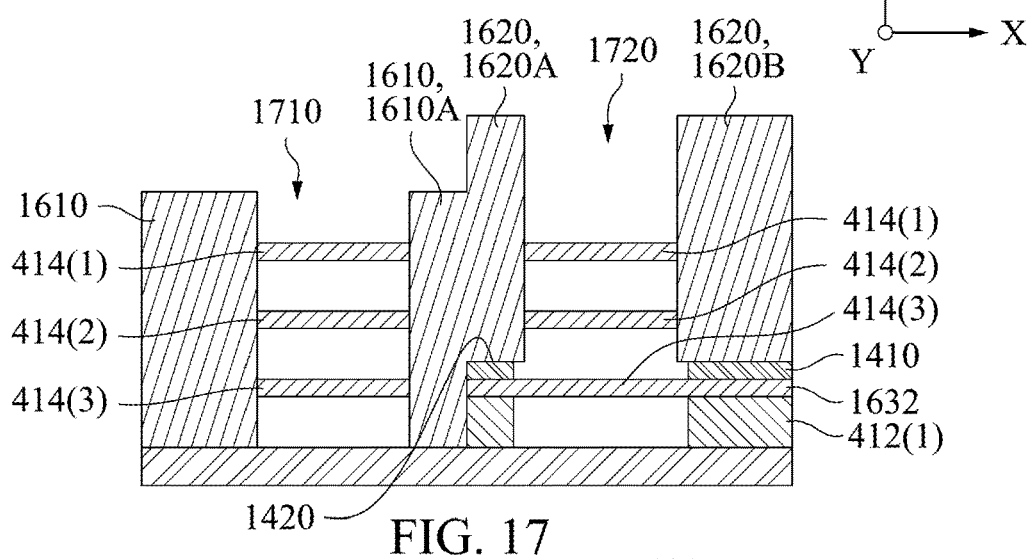

In example operation 1170, with reference also to FIG. 17, the selected channel strips in the first active region 1210 and the second active region 1310 are released through selective etching. For the non-selected semiconductor strip 414(3) the second device is also released. However, due to the auxiliary buffer layer 1410, the resistance is increased for charge carriers to flow from the second source/drain structure 1620 through the auxiliary buffer layer 1410 and the non-selected semiconductor strip 414(3). For example, the auxiliary buffer layer 1410 may be a dielectric material or a different semiconductor material from that of the non-selected semiconductor strip 414(3). Further, the auxiliary buffer layer 1410, the non-selected semiconductor strip 414(3) and/or the fourth buffer layer 412(4) are doped with a different type of dopants from that of the first source/drain structure 1610 and the second source/drain structure 1620. The P-N junction at the respective interface further prevents charge carriers from flowing through the non-selected semiconductor strip 414(3).

The first source/drain structure 1610A contacts the non-selected semiconductor strip 414(3) by one end 1630. However, the charge carrier flow is still buffered by the auxiliary buffer layer 1410 adjacent to the other end 1632 of the non-selected semiconductor strip 414(3) that is adjacent to the second source/drain structure 1620B. Further, in some embodiment, measures are taken to separate the end 1630 of the non-selected semiconductor strip 414(3) from the first source/drain structure 1610A. For example, the example structure of FIG. 7B(i) may be configured for the second active region 1310. The auxiliary buffer layer 720 of FIG. 7B(i) will separate the non-selected semiconductor strip 414(3) from the first source/drain structure 1610A.

The channel releasing operation forms a first void 1710 adjacent to the first source/drain structures 1610 and a second void 1720 adjacent to the second source/drain structures 1620.

Figure 18:
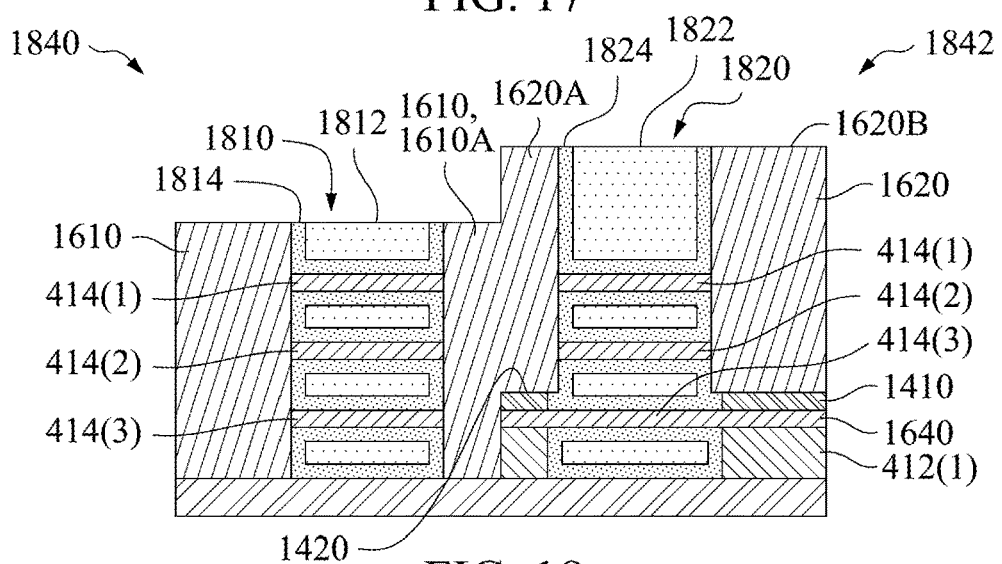

In example operation 1180, with reference also to FIG. 18, a first gate structure 1810 and a second gate structure 1820 are formed within the first void 1710 or the second void 1720, respectively. The first gate structure 1810 includes a gate electrode 1812 and a gate dielectric layer 1814. The second gate structure 1820 includes a gate electrode 1822 and a gate dielectric layer 1824. The first gate structure 1810 is adjacent to, e.g., wraps around, three selected channel strips 414(1), 414(2) and 414(3) in the first active region 1210. The second gate structure 1820 is adjacent to, e.g., wraps around, two selected channel strips 414(1) and 414(2) in the second active region 1310.

The first device 1840 includes three channel strips 414(1), 414(2) and 414(3) in the first active region 1210, the first gate structure 1810 and the first source/drain structures 1610 over the substrate 110. The second device 1842 includes two channel strips 414(1) and 414(2) in the second active region 1310, the second gate structure 1820 and the second source/drain structures 1620 over the substrate 110. With respect to the second device 1842, a non-selected semiconductor strip 414(3) is positioned below the selected channel strips 414(1) and 414(2) and is separated from the second source/drain structures 1620 at least by the auxiliary buffer layer 1410. Although the second gate structure 1820 may also wrap around the non-selected semiconductor strip 414(3), the auxiliary buffer layer 1410 helps prevent charge carriers from flowing through the non-selected semiconductor strip 414(3).

In an embodiment, the first device 1840 and the second device 1842 are the same type of devices, e.g., both N-type or both P-type, and are coupled to one another in parallel. Specifically, the first source/drain structure 1610A of the first device 1840 and the second source/drain structure 1620A of the second device 1842 are electrically connected to one another and are both configured as source terminals or both configured as drain terminals of the respective devices.

Figure 19:
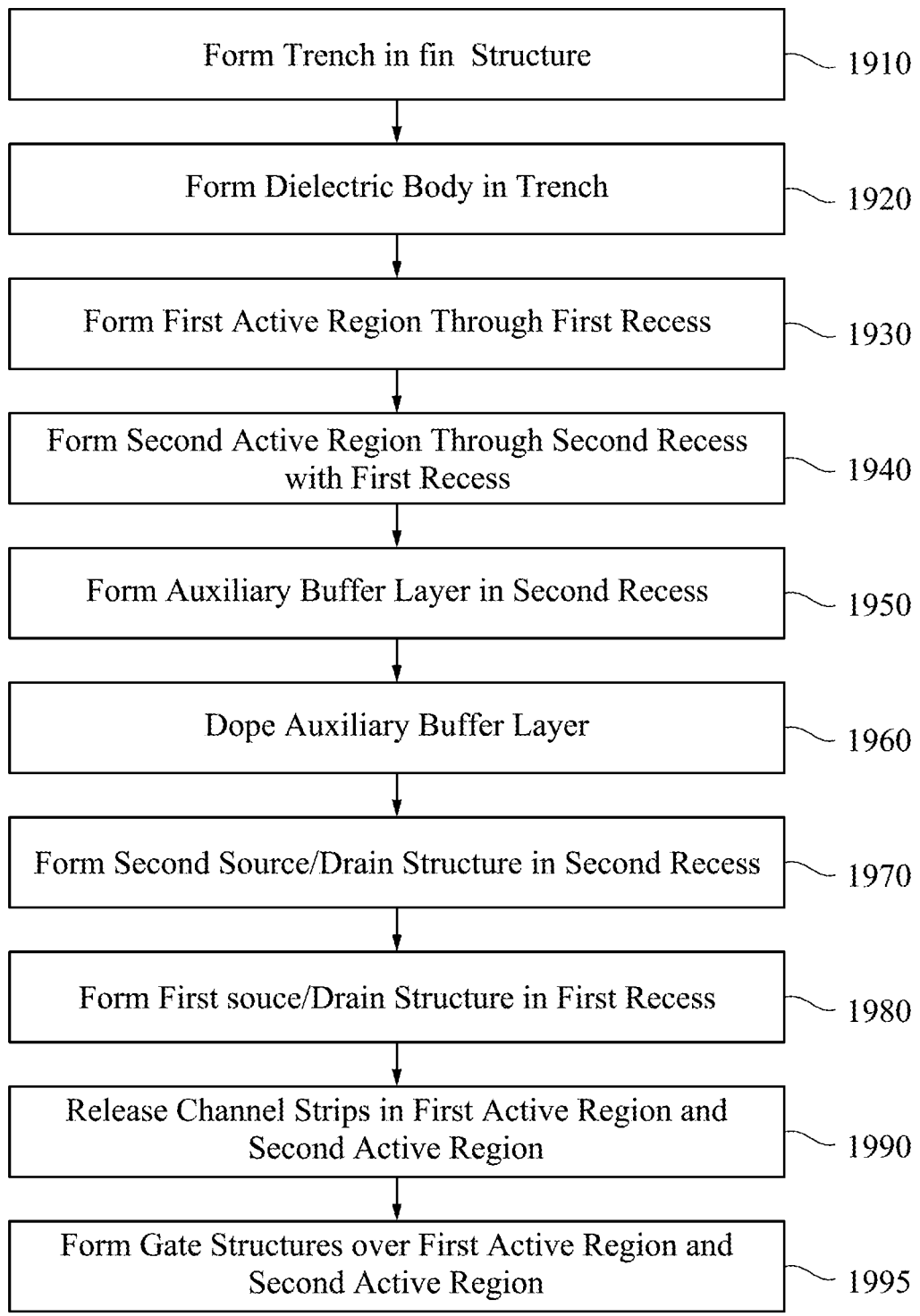
FIG. 19 is another example process according to example embodiments of the disclosure.

FIG. 19 illustrates another example process 1900. FIGS. 20-28 show in the B plane cross-sectional view, a wafer 300 in various stages of fabrication under the example process 1900. At an initial stage, the wafer 2000 may be similar to the wafer 300 having a fin structure 402 formed over a substrate 110 as shown in FIG. 4.

Figure 20:
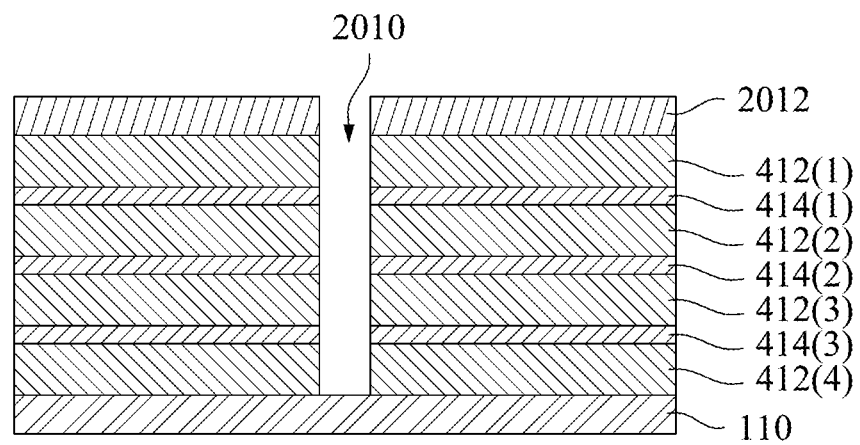
FIGS. 20-28 show views of a wafer in various fabrication stages under the example process of FIG. 19.

Referring to FIG. 19, in example operation 1910, with reference also to FIG. 20, a trench 2010 is formed via a patterned mask layer 2012. The trench 2010 separates a first portion 2020 and a second portion 2030 of the upper portion 410 of the fin structure 402. In an embodiment, the trench 2010 extends downwardly to the substrate 110.

Figure 21:
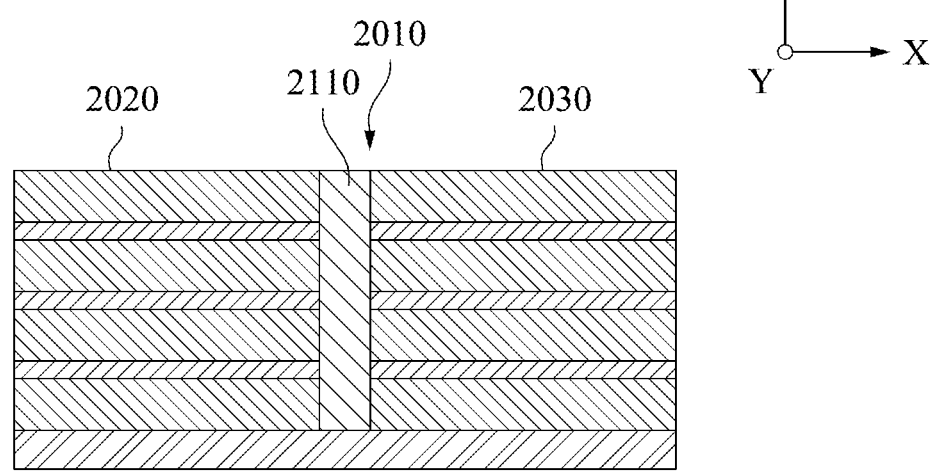

In example operation 1920, with reference also to FIG. 21, a dielectric body 2110 is formed within the trench 2010.

The dielectric body 2110 functions as an insulation layer separating the first portion 2020 and the second portion 2030. The dielectric body 2110 is silicon oxide or other suitable dielectric materials.

Figure 22:
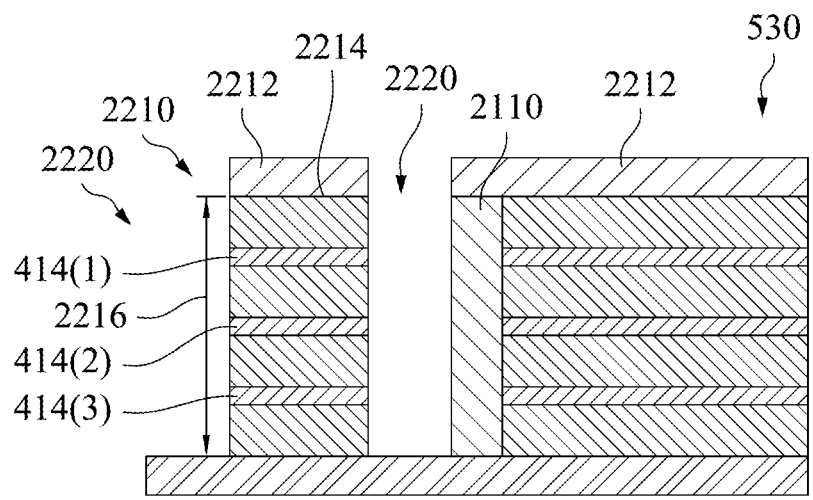

In example operation 1930, with reference also to FIG. 22, a first active region 2210 is defined for a first device. For example, the first active region 2210 is formed through anisotropic etching with a first patterned mask layer 2212. The first active region 2210 is a three-dimensional region defined by a first active area 2214 at the top surface 530 of the upper fin portion 410 and a first depth/height 2216. The first active region 2210 includes three silicon strips 414(1), 414(2) and 414(3) selected as channel strips for the first device.

In defining the first active region 2210, a first recess 2220 is formed. The first recess 2220 is positioned between the first active region 2210 and the dielectric body 2110. The first recess 2220 may extend downwardly until a point between the third selected channel strip 414(3) and the substrate 110. In an embodiment, the first recess 2220 extends as deep as or deeper than the first depth/height 2216 of the first active region 1210.

Figure 23:
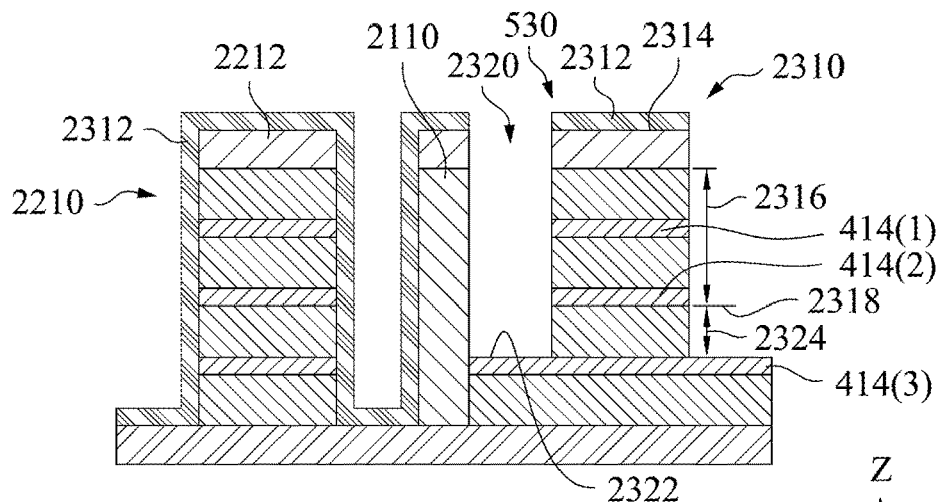

In example operation 1940, with reference also to FIG. 23, a second active region 2310 is defined for a second device. For example, the second active region 2310 is formed through anisotropic etching with a second patterned mask layer 2312. The second active region 2310 is a three-dimensional region defined by a second active area 2314 and a second depth/height 2316. The second active region 2310 includes two selected channel strips silicon strips 414(1), 414(2) counting from the top surface 530. The second depth 2316 is smaller than the first depth 2216. The second active region 2310 extends vertically from the top surface 530 to an end point 2318 downward beyond the lowest selected channel strip, here 414(2), and the highest non-selected semiconductor strip, here 414(3).

In forming the second active region 2310, a second recess 2320 is formed immediately between the second active region 2310 and the dielectric body 2110. An etch stop surface or bottom surface 2322 of the second recess 2320 is lower than the end point 2318 of the second active region 2310. A gap 2324 between the bottom surface 2322 of the second recess 2320 and the end point 2318 of the second active region 2310 is substantially equal to or larger than a thickness of an auxiliary buffer layer to be formed over the bottom surface 2322.

Figure 24:
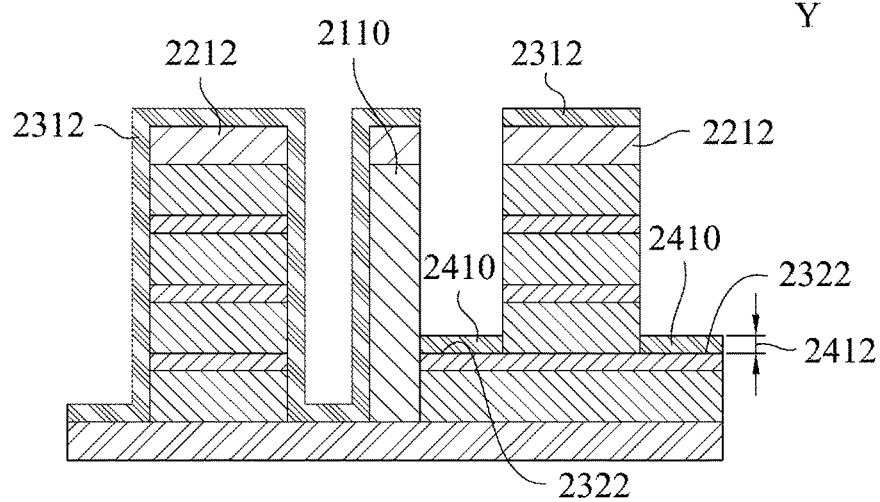

In example operation 1950, with reference also to FIG. 24, an auxiliary buffer layer 2410 is formed over the bottom surface 2322 of the second recess 2320. Specifically, the auxiliary buffer layer 2410 provides additional coverage of the highest/topmost non-selected semiconductor strip 414(3) that is not selected to function as a channel strip for the second device. The auxiliary buffer layer 2410 has a thickness 2412 that is sufficiently large to laterally cover the highest/topmost non-selected semiconductor strip 414(3), e.g., as illustrated in FIG. 7B(i). In an embodiment, the thickness 2412 of the auxiliary buffer layer 1410 is larger than a thickness of the highest/top non-selected semiconductor strip 414(3). In an embodiment, the auxiliary buffer layer 2410 does not extend upwardly beyond the end point 2318 (e.g., the lower point) of the height/depth 1316 of the second active region 1310.

In example operation 1960, the auxiliary buffer layer 2410 and the non-selected semiconductor strip 414(3) are doped to form P-N junction with the source/drain structure to be formed within the second recess 2320. For example, for an N-type second device formed over the second active region 2310, the auxiliary buffer layer 2410 and the non-selected semiconductor strip 414(3) are doped with P-type dopants.

In an embodiment, the fourth buffer strip 412(4) adjacent to the non-selected semiconductor strip 414(3) is also doped with the same dopants as the auxiliary buffer layer 2410 and the non-selected semiconductor strip 414(3).

Figure 25:
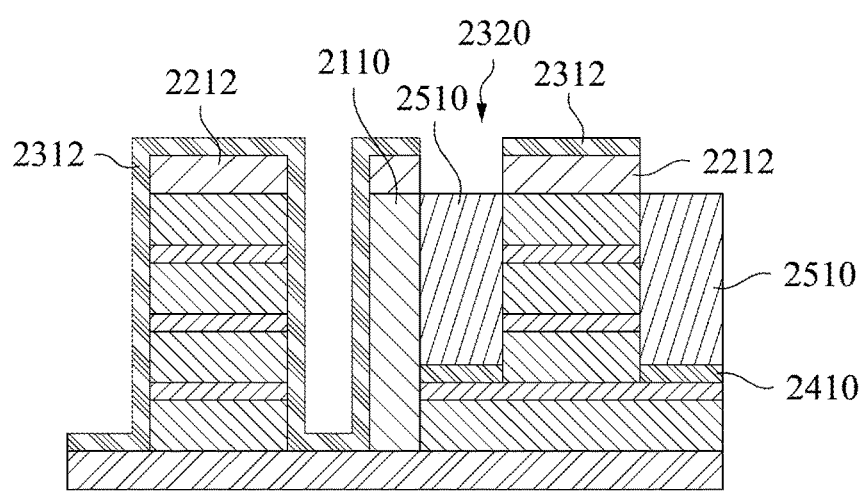

In example operation 1970, with reference also to FIG. 25, with the first recess 2220 encapsulated by the second mask layer 2312, a second source/drain structure 2510 is formed adjacent to the second active region 2310. More specifically, the second source/drain structure 2510 is formed within the second recess 2320 and over the auxiliary buffer layer 2410. The auxiliary buffer layer 2410 separates the second source/drain structure 2510 from the non-selected semiconductor strip 414(3) for the second device. The second source/drain structure 2510 contacts the two selected channel strips 414(1), 414(2) for the second device.

Figure 26:
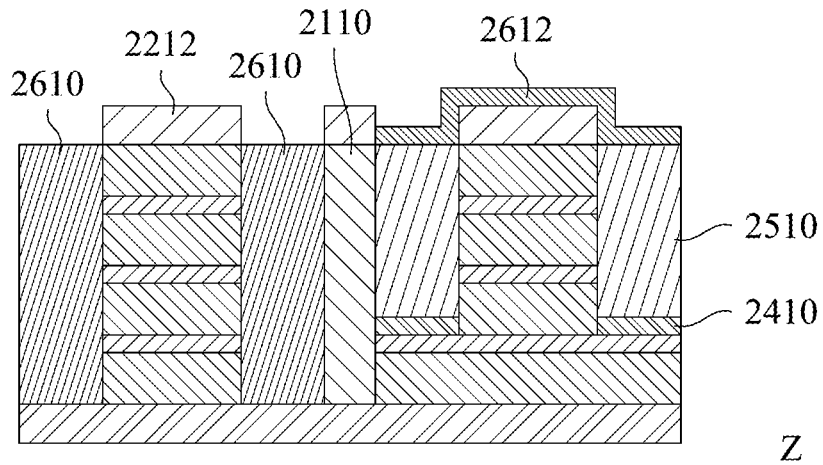

In example operation 1980, with reference also to FIG. 26, the second mask layer 2312 is removed, and a first source/drain structure 2610 is formed adjacent to the first active region 2210, with the second source/drain structure 2510 covered by a third mask 2612. The first source/drain structure 2610 is formed within the first recess 2220 and contacts the three selected channel strips 414(1), 414(2) and 414(3) for the first device.

As the first source/drain structure 2610 and the second source/drain structure 2510 are formed through two separate processes, the first source/drain structure 2610 and the second source/drain structure 2510 may include different materials. Further, the first device and the second device may be configured as different types of devices, e.g., N-type or P-type devices. For example, the first source/drain structure 2610 and the second source/drain structure 2510 are doped with different type of suitable dopants.

Figure 27:
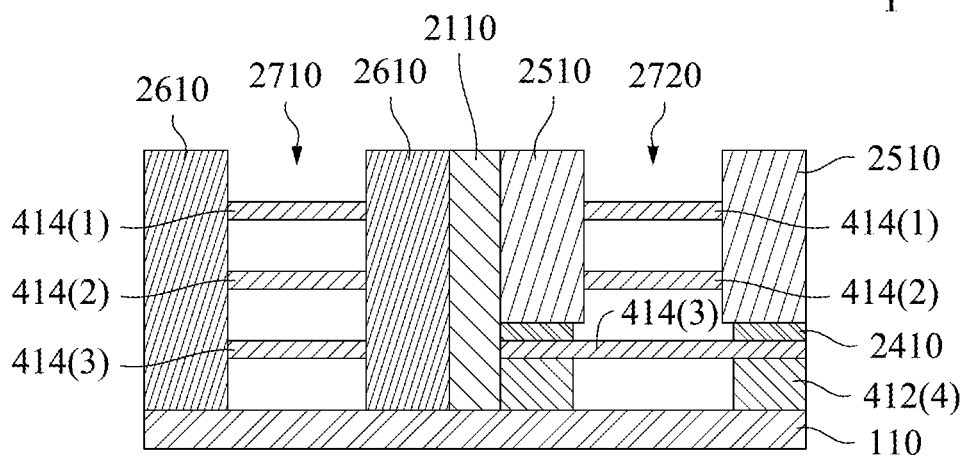

In example operation 1990, with reference also to FIG. 27, the channel strips in the first active region 2210 and the second active region 2310 are released. The channel releasing operation forms a first void 2710 adjacent to the first source/drain structures 2610 and a second void 2720 adjacent to the second source/drain structures 2510.

Figure 28:
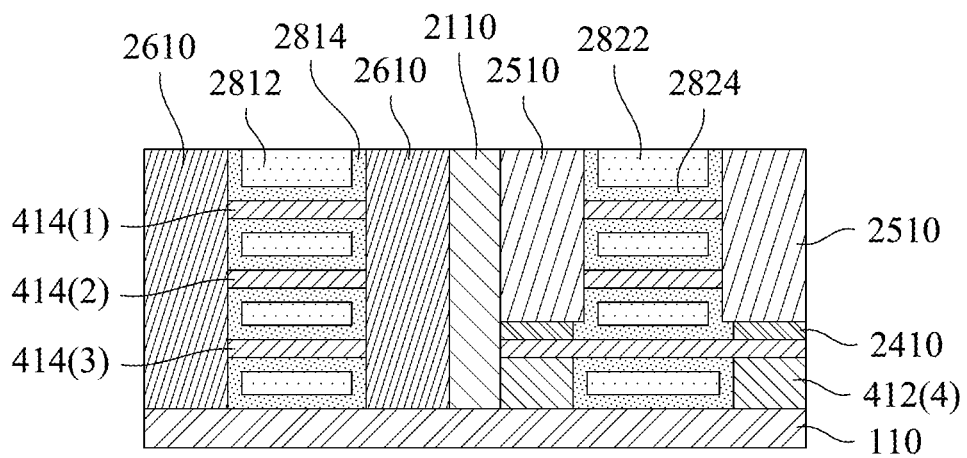

In example operation 1995, with reference also to FIG. 28, a first gate structure 2810 and a second gate structure 2820 are formed within the first void 2710 or the second void 2720, respectively. The first gate structure 2810 includes a gate electrode 2812 and a gate dielectric layer 2814. The second gate structure 2820 includes a gate electrode 2822 and a gate dielectric layer 2824. The first gate structure 2810 is adjacent to, e.g., wraps around, three selected channel strips 414(1), 414(2) and 414(3) in the first active region 2210. The second gate structure 2820 is adjacent to, e.g., wraps around, two selected channel strips 414(1) and 414(2) in the second active region 2310.

The first device 2840 includes three channel strips 414(1), 414(2) and 414(3) in the first active region 2210, the first gate structure 2810 and the first source/drain structures 2610 over the substrate 110. The second device 2850 includes two channel strips 414(1) and 414(2) in the second active region 2310, the second gate structure 2820 and the second source/drain structures 2510 over the substrate 110. With respect to the second device 2850, a non-selected semiconductor strip 414(3) is positioned below the selected channel strips 414(1) and 414(2) and is separated from the second source/drain structures 2510 at least by the auxiliary buffer layer 2410. Although the second gate structure 2820 may also wrap around the non-selected semiconductor strip 414(3), the auxiliary buffer layer 2410 helps prevent charge carriers from flowing through the non-selected semiconductor strip 414(3).

The first device 2840 and the second device 2850 are insulated from one another by the dielectric body 2110. As such, the first device 2840 and the second device 2850 can be separately configured and designed. For example, the first device 2840 and the second device 2850 can be a same type of devices or different types of devices, e.g., N-type or P-type. The use of the auxiliary buffer layer 2410 enables the number of channel strips be selected individually for the first device 2840 or the second device 2850. Further, no semiconductor strips are totally removed among the first device 2840 and the second device 2850 such that the compressive strain between the two devices 2840 and 2850 remains.

For the example processes 1900, 1100 and 200, the channel release and the gate structure formation are conducted after the source/drain structure, which is not limiting. In another embodiment, a replacement gate process may be conducted. In the replacement gate process, the channel release and a dummy gate formation, e.g., of polysilicon, formation may be conducted before the source/drain structures. The dummy gate may be removed and a replacement metal gate may be formed after the source/drain formation.

Other variants are also possible and included in the disclosure. Further, the embodiments and the components thereof may be combined in various ways, which are also included in the disclosure.

The present disclosure may be further appreciated with the description of the following embodiments:

In a device embodiment, a device includes a substrate and a first semiconductor layer and a second semiconductor layer both over the substrate. The first semiconductor layer is positioned over the second semiconductor layer in a first direction. A gate structure is positioned adjacent to the first semiconductor layer and the second semiconductor layer. A source/drain structure is connected to the first semiconductor layer from a second direction that is different from the first direction. A first buffer layer separates the source/drain structure from the second semiconductor layer.

In another embodiment, a semiconductor structure includes a substrate and a first device and a second device both over the substrate. The first device includes a first semiconductor strip, a second semiconductor strip that is separate from the first semiconductor strip and positioned lower than the first semiconductor strip, a first gate structure that wraps around both the first semiconductor strip and the second semiconductor strip, and a first source/drain structure that contacts both the first semiconductor strip and the second semiconductor strip. The second device includes a third semiconductor strip in lateral alignment with the first semiconductor strip, a fourth semiconductor strip in lateral alignment with the second semiconductor strip, the fourth semiconductor strip being separate from the third semiconductor strip and positioned lower than the third semiconductor strip, a second gate structure that wraps around the third semiconductor strip, a second source/drain structure that contacts the third semiconductor strip, and a buffer layer that separates the second source/drain structure from the fourth semiconductor.

In a method embodiment, a wafer is received. The wafer includes a stack of epitaxial layers over a substrate. The stack of epitaxial layers includes a plurality of semiconductor epitaxial layers and a plurality of buffer epitaxial layers stacked in an alternating sequence. A fin structure is formed by patterning the wafer. The fin structure includes a stack of a plurality of semiconductor strips and a plurality of buffer strips stacked in the alternating sequence. The plurality of semiconductor strips includes a first semiconductor strip and a second semiconductor strip that is stacked under the first semiconductor strip. A recess is formed. The recess recedes the first semiconductor strip. A bottom surface of the recess extends downwardly below the first semiconductor strip. An auxiliary buffer layer is formed over the bottom surface of the recess. The auxiliary buffer layer extends upwardly higher than the second semiconductor in the recess. A source/drain structure is formed at least partially within the recess. The first semiconductor strip is released by removing a buffer strip adjacent to the first semiconductor strip. A gate structure is formed adjacent to the first semiconductor strip.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A device, comprising:
a substrate;
a first semiconductor layer and a second semiconductor layer over the substrate, the first semiconductor layer being positioned over the second semiconductor layer in a first direction;
a gate structure wrapping around the first semiconductor layer and the second semiconductor layer;
a source or drain structure connected to the first semiconductor layer from a second direction that is different from the first direction; and
a first buffer layer separating the source or drain structure from the second semiconductor layer.

2. The device of claim 1, wherein the first buffer layer is a semiconductor material different from that of the second semiconductor layer.

3. The device of claim 1, wherein the first buffer layer is a dielectric material.

4. The device of claim 1, wherein the second semiconductor layer is positioned at least partially between the source or drain structure and the substrate in the first direction.

5. The device of claim 1, wherein the first buffer layer is positioned at least partially between the source or drain structure and the substrate in the first direction and is adjacent to the second semiconductor layer in the second direction.

6. The device of claim 1, further comprising a second buffer layer positioned between the first buffer layer and the substrate in the first direction, the second buffer layer having a larger thickness in the first direction than the first buffer layer.

7. The device of claim 1, further comprising a second buffer layer below the first buffer layer, the second buffer layer having a different material from that of the first buffer layer.

8. The device of claim 1, wherein the first buffer layer has a thickness in the first direction larger than a thickness of the second semiconductor layer.

9. The device of claim 1, wherein the first buffer layer has a different doping type from that of the source/drain structure.

10. The device of claim 1, wherein the first semiconductor layer is undoped.

11. A semiconductor structure, comprising:
a substrate;
a first device over the substrate, the first device including:
    a first semiconductor strip;
    a second semiconductor strip that is separate from the first semiconductor strip and positioned between the first semiconductor strip and the substrate;
    a first gate structure that wraps around both the first semiconductor strip and the second semiconductor strip; and
    a first source or drain structure that contacts both the first semiconductor strip and the second semiconductor strip; and
a second device over the substrate, the second device including:
    a third semiconductor strip in lateral alignment with the first semiconductor strip;
    a fourth semiconductor strip in lateral alignment with the second semiconductor strip, the fourth semiconductor strip being separate from the third semiconductor strip and positioned between the third semiconductor strip and the substrate;
    a second gate structure that wraps around the third semiconductor strip;
    a second source or drain structure that contacts the third semiconductor strip; and
    a buffer layer that separates the second source/drain structure from the fourth semiconductor strip.

12. The semiconductor structure of claim 11, further comprising a dielectric body separating the first device from the second device.

13. The semiconductor structure of claim 11, wherein the fourth semiconductor strip is positioned at least partially between the second source/drain structure and the substrate.

14. The semiconductor structure of claim 11, wherein the buffer layer is positioned between the second source or drain structure and the fourth semiconductor strip in a vertical direction.

15. The semiconductor structure of claim 11, wherein an upper surface of the second source or drain structure is higher than an upper surface of the first source or drain structure.

16. The semiconductor structure of claim 11, wherein the buffer layer forms a P-N junction at an interface with the second source or drain structure.

17. A device, comprising:
a substrate;
a stack of layers over the substrate, the stack of layer including a first semiconductor layer, a first buffer layer on the first semiconductor layer, and a second semiconductor layer on the first buffer layer;
a second buffer layer on the first semiconductor layer and laterally adjacent to the first buffer layer; and
a source or drain structure on the second buffer layer and in lateral contact with the second semiconductor layer.

18. The device of claim 17, wherein the second buffer layer is a semiconductor material and includes a different doping type from that of the source or drain structure.

19. The device of claim 17, wherein the second buffer layer is a semiconductor material different from that of the first semiconductor layer.

20. The device of claim 17, wherein the second buffer layer is a dielectric material.

\* \* \* \* \*